US007327016B2

(12) United States Patent
Forbes et al.

(10) Patent No.: US 7,327,016 B2
(45) Date of Patent: *Feb. 5, 2008

(54) HIGH PERMEABILITY COMPOSITE FILMS TO REDUCE NOISE IN HIGH SPEED INTERCONNECTS

(75) Inventors: Leonard Forbes, Corvallis, OR (US);
Kie Y. Ahn, Chappaqua, NY (US);
Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 107 days.

This patent is subject to a terminal disclaimer.

(21) Appl. No.: 10/910,676

(22) Filed: Aug. 3, 2004

(65) Prior Publication Data

US 2005/0006727 A1 Jan. 13, 2005

Related U.S. Application Data

(62) Division of application No. 10/371,349, filed on Feb. 20, 2003, now Pat. No. 6,815,804, which is a division of application No. 10/099,020, filed on Mar. 13, 2002, now Pat. No. 6,846,738.

(51) Int. Cl.
*H01L 39/00* (2006.01)

(52) U.S. Cl. .............. 257/662; 257/659; 257/E29.167; 438/3

(58) Field of Classification Search ................ 257/295, 257/259, 659–665, E29.167; 438/3
See application file for complete search history.

(56) References Cited

U.S. PATENT DOCUMENTS

| 3,478,230 A | 11/1969 | Otter, Jr. et al. |
| 3,676,718 A | 7/1972 | Anderson et al. |
| 3,743,550 A | 7/1973 | Masumoto et al. |
| 3,816,673 A | 6/1974 | Miya ..................... 179/170 R |
| 4,308,421 A | 12/1981 | Bogese, II .................. 174/32 |
| 4,339,305 A | 7/1982 | Jones |
| 4,372,032 A | 2/1983 | Collins et al. ............. 438/285 |

(Continued)

OTHER PUBLICATIONS

Zhang et al ("Investigation on structure and properties of low-temperature sintered composite ferrites", Material Research Bulletin, 35, 2207-2215, 2000).*

(Continued)

*Primary Examiner*—Quoc Hoang
(74) *Attorney, Agent, or Firm*—Schwegman, Lundberg & Woessner, P.A.

(57) ABSTRACT

An electronic system is provided with a structure for improved transmission line operation on integrated circuits. The structure for transmission line operation includes a first layer of electrically conductive material on a substrate. A first layer of insulating material is formed on the first layer of the electrically conductive material. A number of high permeability metal lines are formed on the first layer of insulating material. The number of high permeability metal lines includes composite hexaferrite films. A number of transmission lines is formed on the first layer of insulating material and between and parallel with the high permeability metal lines. A second layer of insulating material is formed on the transmission line and the pair of high permeability metal lines. The structure for transmission line operation includes a second layer of electrically conductive material on the second layer of insulating material.

50 Claims, 8 Drawing Sheets

U.S. PATENT DOCUMENTS

| | | | |
|---|---|---|---|
| 4,640,871 A | 2/1987 | Hayashi et al. | 428/611 |
| 4,749,888 A | 6/1988 | Sakai et al. | 326/4 |
| 4,933,743 A | 6/1990 | Thomas et al. | 357/71 |
| 4,962,476 A | 10/1990 | Kawada | 365/53 |
| 5,019,728 A | 5/1991 | Sanwo et al. | 307/475 |
| 5,128,962 A | 7/1992 | Kerslake et al. | 345/7 |
| 5,135,889 A | 8/1992 | Allen | 437/195 |
| 5,165,046 A | 11/1992 | Hesson | 307/270 |
| 5,223,808 A | 6/1993 | Lee et al. | 333/24.1 |
| 5,352,998 A | 10/1994 | Tanino | 333/247 |
| 5,363,550 A | 11/1994 | Aitken et al. | 29/828 |
| 5,415,699 A | 5/1995 | Harman | 138/238 |
| 5,450,026 A | 9/1995 | Morano | 326/84 |
| 5,510,758 A | 4/1996 | Fujita et al. | 333/247 |
| 5,521,536 A | 5/1996 | Yamashita et al. | 326/82 |
| 5,619,159 A | 4/1997 | Sasaki et al. | 327/537 |
| 5,656,548 A | 8/1997 | Zavracky et al. | 438/23 |
| 5,729,047 A | 3/1998 | Ma | 257/664 |
| 5,772,153 A | 6/1998 | Abaunza et al. | 244/134 F |
| 5,811,984 A | 9/1998 | Long et al. | 326/30 |
| 5,880,601 A | 3/1999 | Kanazawa et al. | 326/68 |
| 5,910,684 A | 6/1999 | Sandhu et al. | 257/758 |
| 6,022,787 A | 2/2000 | Ma | 438/422 |
| 6,075,383 A | 6/2000 | Terletzki | 326/86 |
| 6,133,621 A | 10/2000 | Gaibotti et al. | 257/659 |
| 6,143,616 A | 11/2000 | Geusic et al. | 438/389 |
| 6,219,237 B1 | 4/2001 | Geusic et al. | |
| 6,224,690 B1 | 5/2001 | Andricacos et al. | |
| 6,225,935 B1 | 5/2001 | Sterzer et al. | |
| 6,226,599 B1 | 5/2001 | Namiki | 702/57 |
| 6,242,796 B1 | 6/2001 | Sim et al. | |
| 6,255,852 B1 | 7/2001 | Forbes et al. | 326/86 |
| 6,281,042 B1 | 8/2001 | Ahn et al. | 438/108 |
| 6,350,649 B1 | 2/2002 | Jeong et al. | |
| 6,373,740 B1 | 4/2002 | Forbes et al. | 365/51 |
| 6,414,476 B2 | 7/2002 | Yagi | |
| 6,420,778 B1 | 7/2002 | Sinyansky | 257/664 |
| 6,433,408 B1 | 8/2002 | Anjo et al. | 257/664 |
| 6,452,759 B2 | 9/2002 | Urai | |
| 6,545,338 B1 | 4/2003 | Bothra et al. | 257/508 |
| 6,555,858 B1 | 4/2003 | Jones et al. | |
| 6,569,757 B1 | 5/2003 | Weling et al. | 438/618 |
| 6,570,248 B1 | 5/2003 | Ahn et al. | 257/724 |
| 6,600,339 B2 | 7/2003 | Forbes et al. | 326/86 |
| 6,603,080 B2 * | 8/2003 | Jensen | 174/255 |
| 6,692,898 B2 | 2/2004 | Ning | 430/311 |
| 6,727,105 B1 | 4/2004 | Brug et al. | |
| 6,737,887 B2 | 5/2004 | Forbes et al. | |
| 6,764,941 B2 | 7/2004 | Yang et al. | |
| 6,787,888 B2 | 9/2004 | Forbes et al. | |
| 6,787,906 B1 | 9/2004 | Yang et al. | |
| 6,794,735 B2 | 9/2004 | Forbes et al. | |
| 6,815,804 B2 | 11/2004 | Forbes et al. | |
| 6,833,317 B2 | 12/2004 | Forbes et al. | |
| 6,844,256 B2 | 1/2005 | Forbes et al. | |
| 6,846,738 B2 | 1/2005 | Forbes et al. | |
| 6,852,613 B2 | 2/2005 | Forbes et al. | |
| 6,884,706 B2 | 4/2005 | Forbes et al. | |
| 6,900,116 B2 | 5/2005 | Forbes et al. | |
| 6,903,003 B2 | 6/2005 | Forbes et al. | |
| 6,903,444 B2 * | 6/2005 | Forbes et al. | 257/635 |
| 6,906,402 B2 | 6/2005 | Forbes et al. | |
| 6,914,278 B2 | 7/2005 | Forbes et al. | |
| 6,916,668 B2 | 7/2005 | Spielberger et al. | |
| 6,970,053 B2 | 11/2005 | Akram et al. | |
| 7,101,770 B2 | 9/2006 | Forbes | |
| 7,101,778 B2 | 9/2006 | Forbes et al. | |
| 7,154,354 B2 | 12/2006 | Akram et al. | |
| 7,235,457 B2 | 6/2007 | Forbes et al. | |
| 2001/0000428 A1 | 4/2001 | Abadeer et al. | 333/33 |
| 2001/0017577 A1 | 8/2001 | Toko et al. | |
| 2002/0145901 A1 | 10/2002 | Forbes et al. | |
| 2003/0052298 A1 | 3/2003 | Wang et al. | |
| 2003/0173652 A1 | 9/2003 | Forbes et al. | |
| 2003/0173653 A1 | 9/2003 | Forbes et al. | |
| 2003/0176023 A1 | 9/2003 | Forbes et al. | 438/186 |
| 2003/0176025 A1 | 9/2003 | Forbes et al. | |
| 2003/0176050 A1 | 9/2003 | Forbes et al. | 438/598 |
| 2003/0176052 A1 | 9/2003 | Forbes et al. | |
| 2003/0176053 A1 | 9/2003 | Forbes et al. | |
| 2005/0007817 A1 | 1/2005 | Forbes et al. | |
| 2005/0017327 A1 | 1/2005 | Forbes et al. | |
| 2005/0023650 A1 | 2/2005 | Forbes et al. | |
| 2005/0030803 A1 | 2/2005 | Forbes et al. | |
| 2005/0140462 A1 | 6/2005 | Akram et al. | |
| 2006/0131702 A1 | 6/2006 | Forbes et al. | |
| 2006/0244108 A1 | 11/2006 | Forbes | |
| 2006/0261438 A1 | 11/2006 | Forbes | |
| 2006/0261448 A1 | 11/2006 | Forbes et al. | |
| 2007/0029645 A1 | 2/2007 | Forbes et al. | |

OTHER PUBLICATIONS

Arnoldussen, Thomas C., "A Modular Transmission Line/Reluctance Head Model", *IEEE Transactions on Magnetics*, 24, (Nov. 1998),2482-2484.

Hsu, Yimin, et al., "High frequency field permeability of patterned Ni80Fe20 and Ni45Fe55 thin films", *Journal of Applied Physics*, (Jun. 2001),6808-6810.

Hsu, et al., "Low temperature fired NiCuZn ferrite", *IEEE Transactions on Magnetics*, 30 (6), (1994),4875-4877.

Johnson, H., *High Speed Digital Designs: A Handbook of Black Magic*, Prentice-Hall, Inc., New Jersey, ISBN 0-13-395724-1,(1993),pp. 66-71, 194-197.

Johnson, H. W., et al., "High Speed Digital Design", *A Handbook of Black Magic*, Prentice Hall PTR, Upper Saddle River, New Jersey,(1993),pp. 422 & 426.

Lee, K., et al., "Modeling and Analysis of Multichip Module Power Supply Planes", *IEEE Transactions on Components, Packaging, and Manufacturing Technology*, vol. 18, No. 4, (1995),pp. 628-639.

Rabaey, J. M., *Digital Integrated Circuits, A Design Perspective*, Prentice Hall, Upper Saddle River, New Jersey, ISBN 0-13-178609-1,(1996),pp. 482-493.

Ramo, S., et al., *Fields and Waves in Communication Electronics, Third Edition*, John Wiley & Sons, Inc.,(1994),pp. 428-433.

Senda, M, "Permeability Measurement of Soft Magnetic Films at High Frequency and Multilayering Effect", *IEEE Translation Journal on Magnetics in Japan*, vol. 8, No. 3, (Mar. 1993),pp. 161-168.

Thomas, M., et al., "VLSI Multilevel Micro-Coaxial Interconnects for High Speed Devices", *IEEE International Electron Devices Meeting*, (1990),55-58.

Vusirikala, V., et al., "Flip-chip Optical Fiber Attachment to a Monolithic Optical Receiver Chip", *SPIE Proceedings (The International Society for Optical Engineering)*, 2613, (Oct. 24, 1995),52-58.

Webb, Bucknell C., et al., "High-frequency permeability of laminated and unlaminated, narrow, thin-film magnetic stripes (invited)", *Journal of Applied Physics*, (1991),5611, 5613, 5615.

Webb, Bucknell C., et al., "The high field, high frequency permeability of narrow, thin-film magnetic stripes", *IEEE Transactions of Magnetics*, vol. 27,(1991),pp. 4876-4878.

Zhang, Hongguo, et al., "Investigation on Structure and Properties of Low-Temperature Sintered Composite Ferrites", *Materials Research Bulletin*, 35, (2000),2207-2215.

Zhenxing, Yue, et al., "Low-Temperature Sinterable Cordicrite Glass-ceramics", *High Technology Letters (China)*, 10 (115), (2000),96-97.

* cited by examiner

HIGH PERMEABILITY COMPOSITE FILMS TO REDUCE NOISE IN HIGH SPEED INTERCONNECTS

This application is a Divisional of U.S. application Ser. No. 10/371,349 filed on Feb. 20, 2003 U.S. Pat. No. 6,815,804 which is a Divisional of U.S. application Ser. No. 10/099,020 filed on Mar. 13, 2002 U.S. Pat. No. 6,846,738. These applications are incorporated herein by reference.

FIELD OF THE INVENTION

The present invention relates generally to integrated circuits. More particularly, it pertains to structure and methods for improved transmission line interconnections.

BACKGROUND OF THE INVENTION

The metal lines over insulators and ground planes, or metal lines buried in close proximity to dielectric insulators and used for integrated circuit interconnects are in reality transmission lines or strip lines. The use of coaxial interconnection lines for interconnections through the substrate in CMOS integrated circuits can also be termed transmission lines or strip lines. Interconnection lines on interposers or printed circuit boards can also be described as transmission lines.

The low characteristic impedance of any of these lines, transmission, strip lines or coaxial lines results in part from the low characteristic impedance of free space, $Z_o = (\mu_o/\epsilon_o)^{1/2} = 377$ ohms, and in part from the dielectric material used for electrical insulation in the lines which has a higher dielectric permittivity than free space. Most commonly used coaxial lines have an impedance of 50 ohms or 75 ohms, it is difficult to achieve larger values. In the past these effects have not received much consideration on the integrated circuits themselves since the propagation speed with oxide insulators is 15 cm/ns and switching speeds on integrated circuits of the size of a centimeter have been slower than 1/15 ns or 70 picoseconds. Transmission line effects only become important if the switching time is of the same order as the signal propagation time. Switching times in CMOS circuits have been limited by the ability to switch the capacitive loads of long lines and buffers, and charge these capacitances over large voltage swings to yield a voltage step signal.

Most current CMOS integrated circuit interconnections rely on the transmission of a voltage step or signal from one location to another. FIG. 1 illustrates R-C limited, short high impedance interconnections with capacitive loads. The driver may simply be a CMOS inverter as shown in FIG. 1 and the receiver a simple CMOS amplifier, differential amplifier, or comparator.

As shown in FIG. 1, the CMOS receiver presents a high impedance termination or load to the interconnection line. This is problematic in that:

(i) the switching time response or signal delay is determined mainly by the ability of the driver to charge up the capacitance of the line and the load capacitance, (ii) the line is not terminated by its characteristic impedance resulting in reflections and ringing, (iii) large noise voltages may be induced on the signal transmission line due to capacitive coupling and large voltage swing switching on adjacent lines, the noise voltage can be a large fraction of the signal voltage.

The transmission of voltage step signals only works well if the interconnection line is short so that the stray capacitance of the line is small. Long lines result is slow switching speeds and excessive noise due to capacitive coupling between lines.

FIG. 1 shows the commonly used signal interconnection in CMOS integrated circuits, where voltage signals are transmitted from one location to another. This is problematic in that the interconnection lines are normally loaded with the capacitive input of the next CMOS stage and the large stray capacitance of the line itself. The response time is normally slow due to the limited ability of the line drivers to supply the large currents needed to charge these capacitances over large voltage swings. These times are usually much larger than the signal transmission time down the line so a lumped circuit model can be used to find the signal delay, as shown in FIG. 1.

In the example here the output impedance of the source follower is $1/g_m = 1000$ ohms, and a line 0.1 cm long will have a capacitance of about 0.2 pF if the dimensions of the line are about 1 micron by 1 micron and the insulator or oxide thickness under the line is 1 micron. This results in a time constant of 200 pS and it takes about 400 pS to charge the line from 10% to 90% of the final voltage value. This is a relatively slow response.

Furthermore, if two interconnection wires are in close proximity then the voltage swing on one line can induce a large voltage swing or noise voltage on the adjacent line as shown in FIG. 1. The noise voltage is just determined by the capacitance ratios, or ratio of interwire capacitance, Cint, to the capacitance of the interconnection wire, C.

In prior art these can be comparable, as shown, and depend on the insulator thickness under the wires and the spacing between the wires. Therefore, the noise voltage can be a large fraction of the signal voltage if the wires are in close proximity and far removed from the substrate by being over thick insulators. The emphasis in prior art has always been in trying to minimize the capacitance of the interconnection line, C, by using thick insulators and low dielectric constant materials.

Thus, there is a need to provide a solution for these types of problems for CMOS-scaled integrated circuits. Due to the continued reduction in scaling and increases in frequency for transmission lines in integrated circuits such solutions remain a difficult hurdle. For these and other reasons there is a need to reduce noise in high speed interconnections.

DETAILED DESCRIPTION

Figure 1:
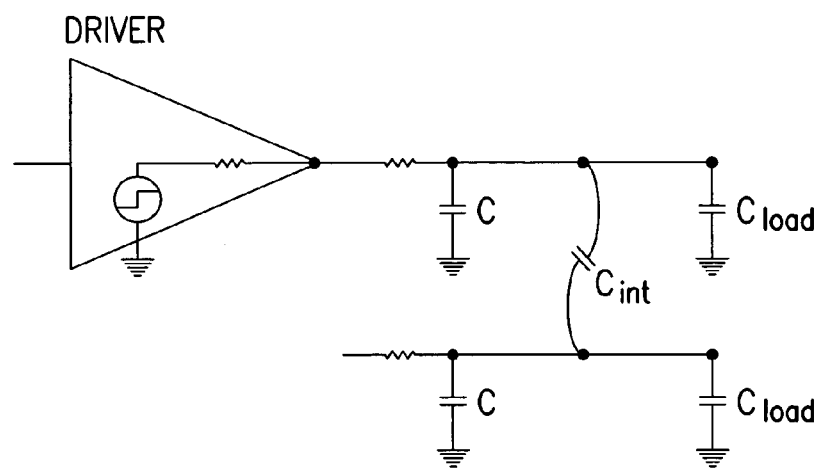
FIG. 1 shows the commonly used signal interconnection in CMOS integrated circuits, where voltage signals are transmitted from one location to another.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 2:
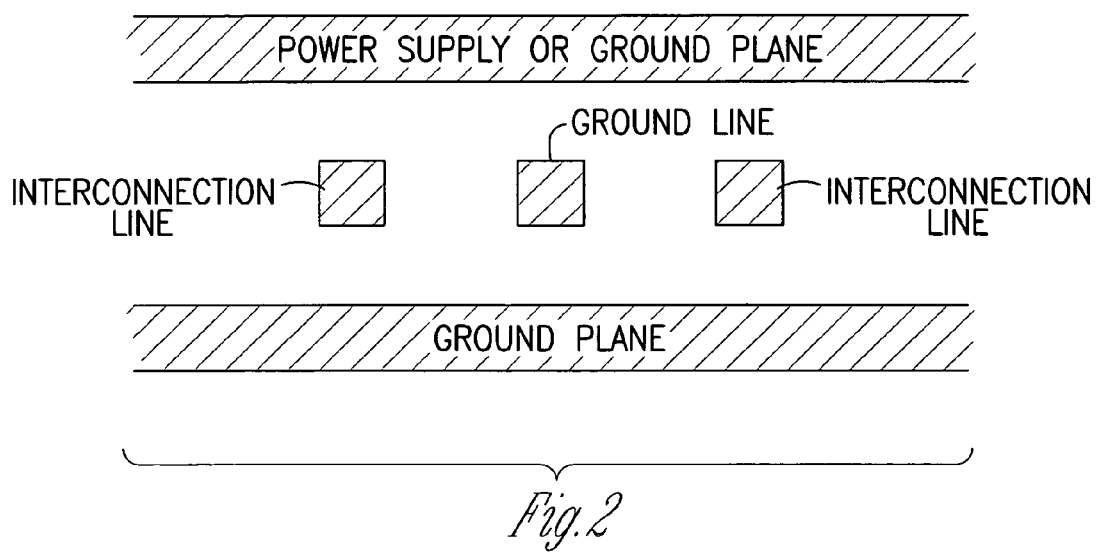
FIG. 2 illustrates one technique to minimize the interwire capacitance, Cint, by using an intermediate line at ground for shielding.

FIG. 2 illustrates one technique to minimize the interwire capacitance, Cint, by using an intermediate line at ground for shielding. This technique is disclosed in a co-pending application by a common inventor, Dr. Leonard Forbes, entitled "Novel Transmission Lines for CMOS Integrated Circuits," Ser. No. 09/364,199. The same is incorporated herein by reference.

Also, as disclosed in issued U.S. Pat. No. 6,255,852 by Dr. Leonard Forbes, entitled "Current Mode Interconnects on CMOS Integrated Circuits," low impedance transmission lines such as those which exist on CMOS integrated circuits are more amenable to signal current interconnections over longer interconnection lines. U.S. Pat. No. 6,255,852 is incorporated herein by reference. These longer interconnection lines may be on the CMOS integrated circuit itself, an interconnection line between integrated circuits mounted in a module as for instance a memory module, an interposer upon which these integrated circuits are mounted, or on a printed circuit board upon which the integrated circuits are mounted. If the line is terminated with a low input impedance current sense amplifier then the line can be regarded as a transmission line terminated with the characteristic impedance of the interconnection line. This is advantageous in that:

(i) the signal delay depends only on the velocity of light on the line and is easily predictable and reproducible, eliminating or allowing for compensation for signal and/or clock skew, (ii) there are no reflections at the receiving end of the line and this minimizes ringing, (iii) noise signals will be smaller due to weaker coupling between lines resulting in better signal to noise ratios, the noise current will only be a small fraction of the signal current. The transmission of current signals rather than voltage signals is more desirable at high speeds, and in high speed or high clock rate circuits over longer interconnection lines. A CMOS circuit might for instance use a combination of techniques, conventional voltage signals over short interconnections with little coupling between lines and current signals over longer interconnections and where lines might be in close proximity.

Figure 3A:
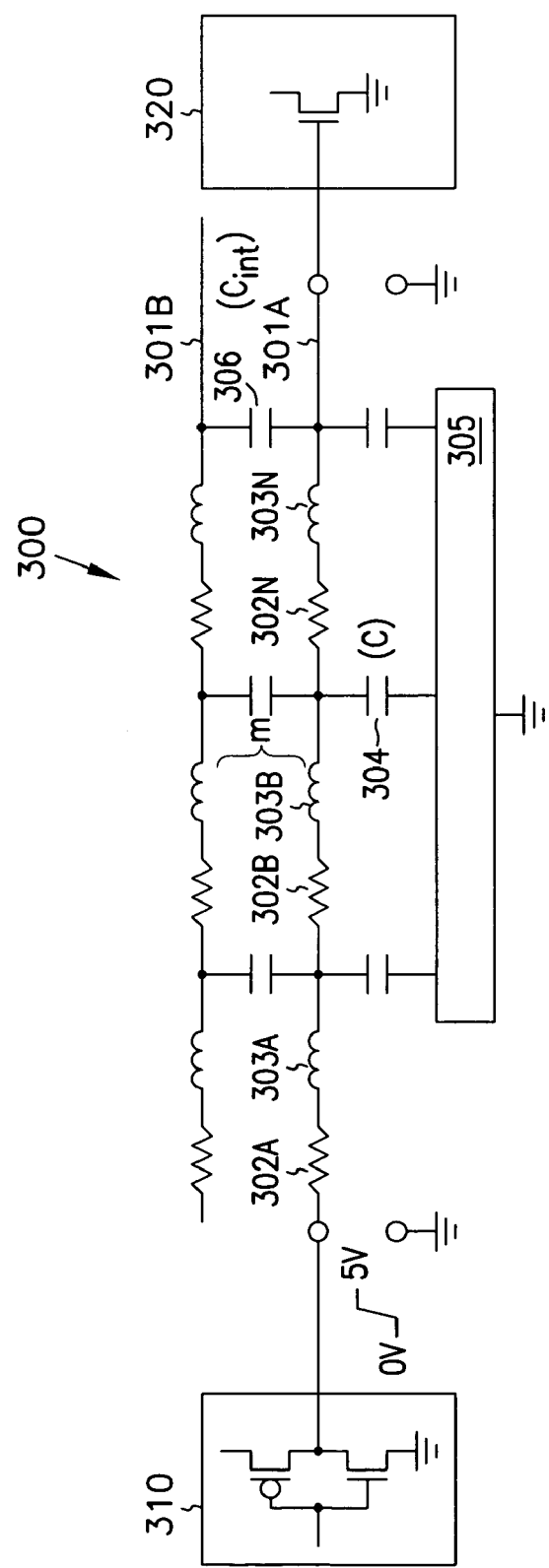
FIG. 3A illustrates signal transmission using correctly terminated transmission lines and current sense amplifiers, according to the teachings of the present invention.

FIG. 3A illustrates capacitive coupling between low impedance terminated interconnection lines. FIG. 3A illustrates signal transmission using correctly terminated transmission lines and current sense amplifiers, such as those disclosed in issued U.S. Pat. No. 6,255,852 by Dr. Leonard Forbes, entitled "Current Mode Interconnects on CMOS Integrated Circuits." The signal interconnection or transmission line is terminated by the matching impedance of the current sense amplifier. This means the impedance looking into the sending end of the transmission line will just be the characteristic impedance of the line and the signal delay down the line will just be the small propagation delay down the line. The response time of the source follower being used as a line driver will be determined primarily by the longer rise time of the input voltage. This driver will supply a signal current whose rise time is basically just that of the input voltage signal.

FIG. 3A also illustrates the coupling to another signal line in close proximity, in this case the coupling will be both magnetic through the induced magnetic fields and mutual inductance and capacitive coupling. The noise current induced will be shown to be only a fraction of the signal current or the signal to noise ratio is high. Once received this signal current is converted back to a signal voltage by the current sense amplifier at the receiving end of the line. Since the signal propagation time is small, the signal delay time will in practice be limited by the rise time of the signal to the gate of the source follower. Since the gate capacitance of the source follower is small this can be very fast.

Other methods to minimize capacitive coupling between lines use low dielectric constant materials or insulators, or ground shields, such as shown in FIG. 2. In the present invention, it is desirable to use very low impedance lines, it is also desirable to keep the capacitive coupling between lines small and the magnitude of voltage steps on the interconnection lines small. The current step will induce a voltage step at the load which is the magnitude of the load impedance times this current step. This voltage step while small, 1 mA times Zin in this example, still can induce a capacitively coupled noise signal on an adjacent line.

FIG. 3A shows an integrated circuit 300 in which a first transmission line, strip line, or coaxial line 301A interconnects circuit components, e.g. a driver 310 to a receiver 320. FIG. 3A illustrates a first transmission line 301A over a conductive substrate 305. Conventionally, a voltage signal (i.e. a 5 volt signal swing) is provided by the driver 310 to the transmission line 301A. The schematic illustrations in FIG. 3A demonstrate that the transmission line 301A includes a small resistance, shown generally by resistor symbols 302A, 302B, . . . , 302N. Also, the transmission line 301A includes a distributed inductance (L) which is represented generally by inductor symbols 303A, 303B, . . . , 303N. In one embodiment, the driver 310 may be an inverter 310 and the receiver 320 may be an amplifier 320. Capacitor plate symbols 304 (C) are used to schematically represent the capacitive coupling which occurs between the transmission line 301A and the conducting substrate 305. In FIG. 3A, a second transmission line 301B is shown. Capacitor plate symbols 306 are used to schematically represent the capacitive coupling (Cint) which similarly occurs between the first transmission line 301A and neighboring transmission lines, e.g. second transmission line 301B.

Figure 3B:
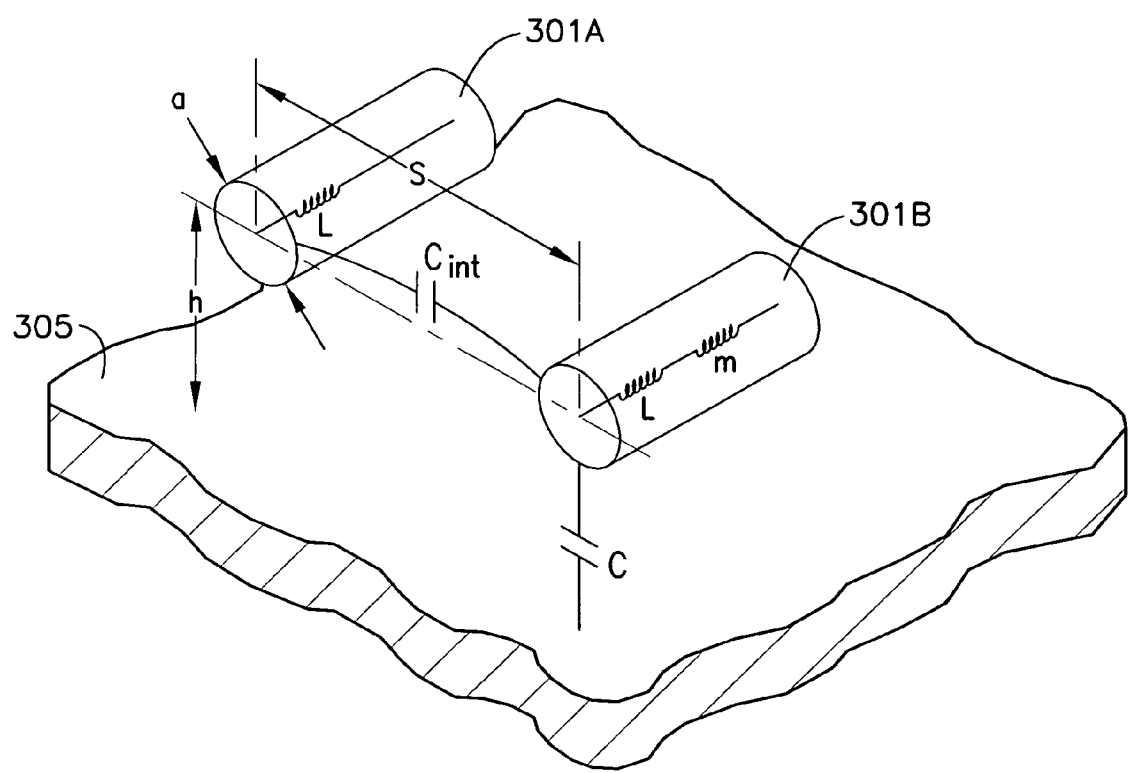
FIG. 3B illustrates two interconnection lines in close proximity and the interwire capacitance between these lines and the mutual inductance coupling between the lines.

FIG. 3B illustrates two interconnection lines in close proximity and the interwire capacitance between these lines and the mutual inductance coupling between the lines. (See generally, H. Johnson, "High-Speed Digital Circuits: A Handbook of Black Magic," Prentice-Hall, 1993; and S. Ramo, J. R. Whinnery and T. Van Duzer, "Fields and Waves in Communication Electronics, 3rd Ed.," John Wiley, New York, 1994). Although the interconnection lines on integrated circuits might tend to be more square than round, the concepts involved can be most conveniently described and formulas approximated by assuming for simplicity that the lines are round or circular. Approximate formulas have been developed describing round wires over conductive planes or two wires in close proximity, in this case they are interconnection wires on a CMOS integrated circuit, interposer, or printed circuit board.

In FIG. 3B the illustrated pair of interconnect, or transmission lines, 301A and 3011B, displayed in a perspective view, are separated from a conducting substrate 305. The transmission lines, 301A and 301B are spaced a distance (h) from the conducting substrate 305 and a distance (s) from one another. The transmission lines, 301A and 301B, are shown in a circular geometry, each with a diameter (a). Some general characterizations can be made about the transmission lines, 301A and 301B, in an environment floating or suspended in air. First, each transmission line, 301A and 301B, will have a characteristic impedance in air ($Z_0$) approximately or generally given by $Z_0 \approx 60 \ln(4\ h/a)$. Second, each transmission line, 301A and 301B, has a inductance (L) which is $L \approx 5.08 \times 10^{-9} \times \ln(4\ h/a)$ Henrys/inch (H/inch). Additionally, the two transmission lines, 301A and 301B, will exhibit an interwire mutual inductance (M) which is given by $M = L \times \{1/[1+(s/h)^2]\}$. Third, an interwire capacitive coupling (Cint) exists between the two transmission lines, 301A and 301B, and is expressed as $Cint = \pi\epsilon/\cos h^{-1}(s/a)$. Using the trigonometric relationship of $\cos h^{-1}(y) \approx \ln(2y)$, the interwire capacitive coupling can similarly be expressed as $Cint = \pi\epsilon/\ln(2\ s/a)$. Thus, in this environment, the two transmission lines, 301A and 301B, exhibit an interline capacitance (Cint) given by $Cint = \{0.7/[\ln(2\ s/a)]\}$ pico Farads/inch (pF/inch). Lastly, each transmission line, 301A and 301B, will further exhibit capacitive coupling C with the conducting substrate 305.

Again, in FIG. 3B the transmission lines, 301A and 301B, are spaced a distance (h) from the conducting substrate 305. Using the method of images and the interwire capacitive relationship, $Cint \approx \pi\epsilon/\ln(2\ s/a)$, a single transmission line, 301A, over a conducting substrate is given by $C \approx 2\pi\epsilon/\ln(4\ h/a)$ pF/inch where $h = s/2$. Thus, in this environment, the two transmission lines, 301A and 301B, exhibit a capacitance, or capacitive coupling C with the conductive substrate 305 which is $C \approx \{1.41/[\ln(4\ h/a)]\}$ pF/inch. The above equations have been presented by assuming that the transmission lines have round or circular geometries. Actual transmission lines on integrated circuits might tend to be more square or rectangular than round due to present lithography techniques. Nevertheless, due to the actual physical size of transmission lines, determined according to minimum lithographic feature techniques, the formulas scale well to square, rectangular or other physical cross sectional geometries for the transmission lines.

The signal rise time (trise) in conventional voltage signaling is normally slow due to the limited ability of the transmission line drivers to supply the large currents needed to charge these capacitances over large voltage swings. The signal rise times are usually much larger than the signal transmission time down the line (tprop). Additionally, if two transmission lines are in close proximity then the voltage swing on one transmission line can induce a large voltage swing or noise voltage on the adjacent transmission line. The noise voltage is determined by the capacitance ratios of interwire capacitance, Cint, to the capacitance of the transmission line with the substrate, C. In other words, the noise voltage is determined according to the ratio Cint/C.

The values of Cint and C can be comparable, dependant upon the insulator thickness (h) under the transmission lines and the spacing between the transmission lines. Emphasis in prior art is placed upon minimizing the capacitance of the transmission line, C, by using thick insulators and low dielectric constant materials. Emphasis is also to some extent placed upon minimizing the interwire capacitance, Cint. Thus, the approach in the prior art results in a noise voltage which can be a large fraction of the signal voltage if the transmission lines are in close proximity and far removed from the substrate by being over thick insulators.

Figure 4:
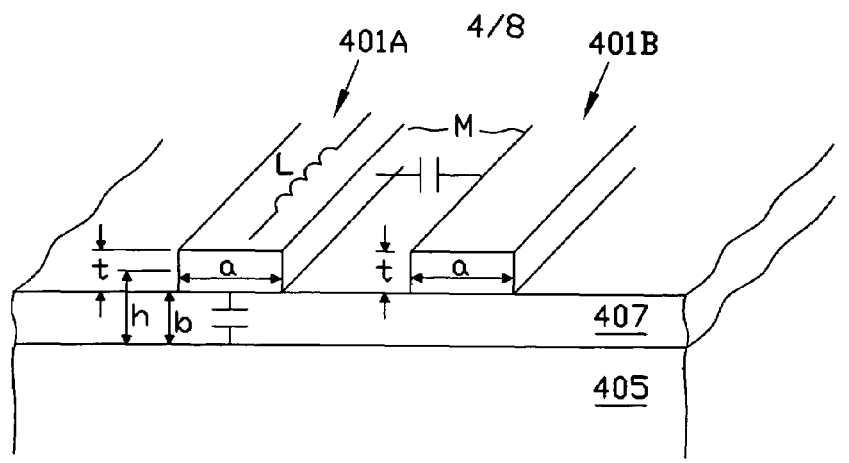
FIG. 4 is a perspective view illustrating a pair of neighboring transmission lines above a conductive substrate, according to the teachings of the present invention.

FIG. 4 is a perspective view illustrating a pair of neighboring transmission lines, 401A and 401B, above a conductive substrate 405 according to the teachings of the present invention. The present invention is designed to use current signaling across low impedance transmission lines, 401A and 401B, to reduce signal transmission delay and to improve signaling performance over longer transmission lines. Under conventional voltage signaling the current provided in the transmission lines is too weak to provide clean, accurately detectable current signal. In order to obtain better current signals in the transmission lines the signal to noise ratio of the transmission lines must be improved.

To improve the signal to noise ratio of the transmission lines, 401A and 401B, the capacitance coupling between the transmission lines, 401A and 401B, and the conductive substrate 405, is made large. The characteristic impedance (Zo) of the transmission lines, 401A and 401B, can be expressed as $Z_0 = \sqrt{L/C}$. Thus, making C large makes the characteristic impedance Zo=Zin, small and similarly makes the voltage division ratio for capacitive coupling small. In the present invention, C increases as the insulator 407 thickness (h) separating the transmission lines, 401A and 401B, from the ground plane, or substrate 405 is decreased. In FIG. 4, the transmission lines, 401A and 401B, are separated a distance (h) from the conducting substrate 405 by an insulating layer 407. In one embodiment, the insulating layer 407 is an oxide layer 407. The capacitive coupling C between the transmission lines, 401A and 401B, and the conducting substrate 405 separated by an oxide layer 407 is given as $C \approx 1.66/[\ln(4\ h/a)]$ pF/cm. Additionally, the inductance (L) for the transmission lines, 401A and 401B, over the oxide layer 407 is $L \approx 2 \times \ln(4\ h/a)$ nanoHenrys/centimeter (nH/cm). The transmission lines, 401A and 401B, are shown in a square geometry having a width (a). The insulator 407 has a thickness (b) separating the transmission lines, 401A and 401B from the substrate. 405. According to one embodiment of the present invention, the insulator thickness (b) is made thinner than the thickness (t) of the transmission lines, 401A and 401B. The center of the transmission lines, 401A and 401B, are a distance (h) above the conducting substrate 405.

According to the teachings of the present invention, in one embodiment the thickness (b) of the insulator is equal to or less than 1.0 micrometers ($\mu$m). In one embodiment, the thickness (t) of the of the transmission lines, 401A and 401B is approximately equal to 1.0 micrometers ($\mu$m). In one embodiment, the thickness (t) of the transmission lines, 401A and 401B is less than 1.0 ($\mu$m). In one embodiment, the width (a) of the transmission lines, 401A and 401B is approximately 1.0 micrometers ($\mu$m). As one of ordinary skill in the art will appreciate upon reading the present disclosure, one embodiment of the present invention includes transmission lines 401A and 401B formed according to the above described dimensions and separated from the substrate 405 by an insulator having a thickness (b) of less than 1.0 micrometers ($\mu$m). In one exemplary embodiment, the transmission lines 401A and 401B have an input impedance ($Z_0$) approximately equal to 50 ohms.

A co-pending application, by the same inventors, entitled "Capacitive Techniques to Reduce Noise in High Speed Interconnections," application Ser. No. 10/060,801, filed Jan. 30, 2002, describes minimizing interwire coupling capacitance, and making the insulator thickness over the group plane small, minimizing Zo. The same is incorporated herein by reference. According to the teachings described therein, a characteristic impedance of 50 ohms is easily realizable.

Figure 5:
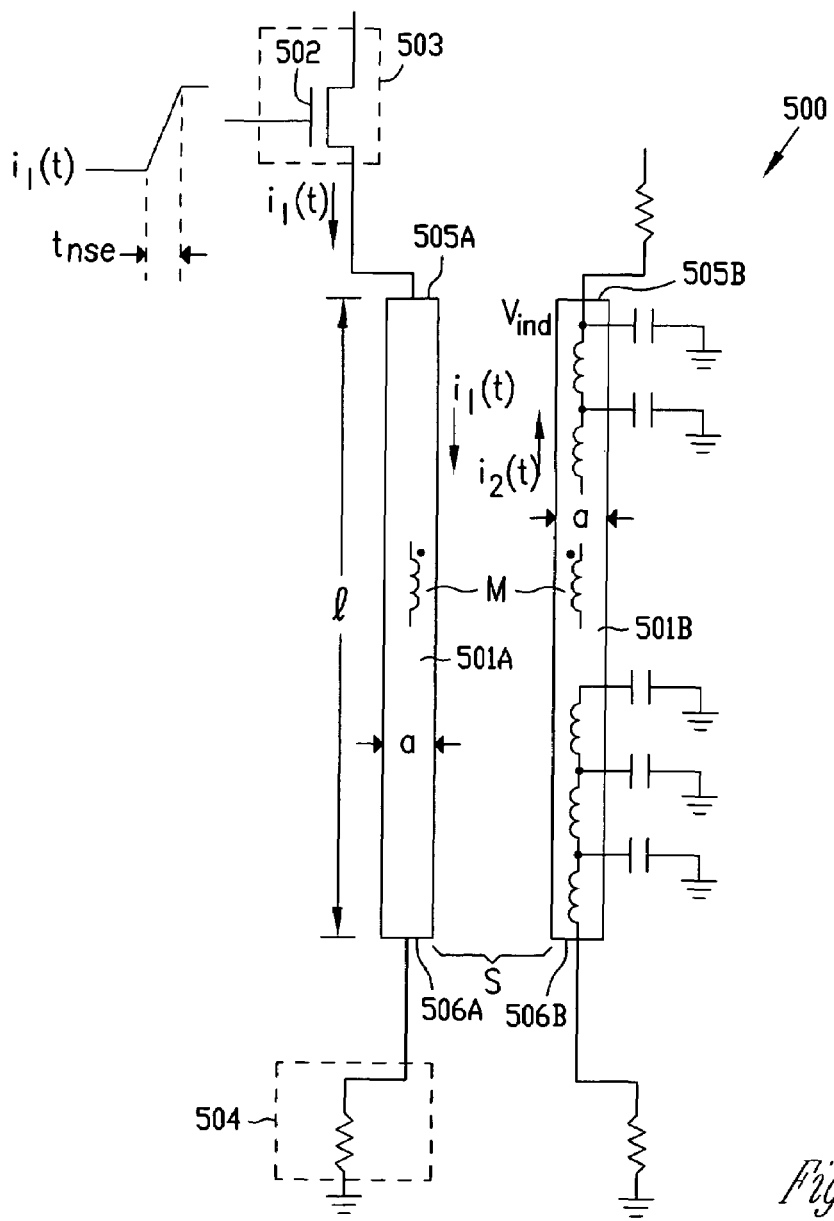
FIG. 5 is a schematic diagram for an interconnection on an integrated circuit according to the teachings of the present invention.

FIG. 5 is a schematic diagram for an interconnection on an integrated circuit 500 according to the teachings of the present invention. The interconnection on the integrated circuit 500 includes a pair of transmission lines, 501A and 501B, in close proximity. The first transmission line 501A is separated by a distance (s) from the second transmission line 501B. The first transmission line 501A and the second transmission line 501B each have a first end, 505A and 505B respectively. In one embodiment, the first end 505A for the first transmission line 501A is coupled to a driver 503. The first transmission line 501A and the second transmission line 501B each have a second end, 506A and 506B respectively. In one embodiment, the second end 506A is coupled to a termination 504 formed using a complementary metal oxide semiconductor (CMOS) process.

Reference to FIG. 5 is useful in explaining the reduced amount of noise current between two transmission lines, 501A and 501B, using the current signaling technique of the present invention. In one embodiment of the present invention, transmission lines, 501A and 501B, have a low characteristic impedances Zo. In one embodiment, the input impedance (Zin) seen by the driver 503 coupling to the first transmission line 501A (in this example the "driven line") is just the characteristic impedance Zo for the first transmission line 501A. In other words, the CMOS termination 504 is impedance matched to the characteristic impedance Zo of the transmission line 501A.

In one embodiment, the first transmission line 501A is separated by approximately 3 $\mu$m from the second transmission line 501B and the transmission lines have a length (l) of at least 500 $\mu$m. In another embodiment the transmission lines, 501A and 501B, have a length (l) of at least 0.1 cm, or 1000 $\mu$m. As in FIG. 4, the transmission lines, 501A and 501B, are separated from a conducting substrate by an insulating layer. In one embodiment, the insulating layer is an oxide layer. In this embodiment, the capacitive coupling C between the transmission lines, 501A and 501B, and the conducting substrate is given as $C \approx 1.66/[\ln(4\ h/a)]$ pF/cm. In one exemplary embodiment, each transmission line, 501A and 501B, has a length (l) of 0.1 cm or 1000 $\mu$m, each has a width (a) of approximately 1.0 $\mu$m, and the insulator layer thickness (b) is approximately 0.2 $\mu$m. In this embodiment, the ln(4 h/a) will be approximately 1. Thus, $C \approx 1.66/[\ln(4\ h/a)]$ pF/cm and for a line 0.1 cm long will produce a $C \approx 0.2$ pF. In the same embodiment, the inductance (L) for the transmission lines, 501A and 501B, over the oxide layer is $L \approx 2 \times \ln(4\ h/a)$ nH/cm, or L=0.2 nH for a line 0.1 cm long. In this embodiment, a 1 milli Ampere (mA) current step, $i_1(t)$, is applied to the gate 502 of a transistor driver 503. In one embodiment, the driver is an n-channel source follower driver 503. In this embodiment, the rise time (trise) on the gate 502 of the driver 503 is approximately 100 ps. This is the limiting time on the system response since the signal delay (tprop) down a the transmission line is proportional to $\sqrt{LC}$. For a 0.1 cm transmission line, 501A or 501B, tprop is only 7 ps. A current, $di_1(t)/dt$, of approximately $1 \times 10^7$ A/sec is then produced on the first transmission line 501A.

The noise current $i_2(t)$ induced on the second transmission line 501B by interwire capacitive coupling (Cint) is calculated as approximately $i_2(t)=(Cint) \times (V_1 step/trise)$. The interwire capacitive coupling (Cint) between the transmission lines, 501A and 501B, separated by an oxide dielectric can be expressed as Cint=0.46 pF/cm. Again, for a 0.1 cm transmission line, 501A or 501B, Cint$\approx$0.05 pF. As described in connection with FIG. 5, a 1 mA current provided to the first transmission line 501A having a low characteristic impedance Zo of approximately 30 Ohms will result in a corresponding 30 mV Voltage step ($V_1$step) on the first transmission line 501A. Therefore, if trise is 100 ps a noise current, $i_2(t)$, of approximately 0.015 mA is produced on the second, neighboring, transmission line 501B. This noise current, $i_2(t)$, induced in the second transmission line 501B is a very small percentage, or about 1%, of the signal current $i_1(t)$ provided to the first transmission line 501A. Hence, the signal to noise ratio (SNR) will be large. It can be shown, in general, that a signal to noise ratio (SNR) for the present invention, due to capacitive coupling is of the order (C/Cint) (trise/tprop); where, trise, is the rise time for the current signal and, tprop, the signal propagation time down the first transmission line 501A. The rise time on the signal current, $i_1(t)$, in the first transmission line 501A is fast and just follows the rise time (trise) on the input signal, or 100 ps. The response time of this system utilizing current signals is thus much faster than those using voltage signals.

Reference to FIG. 5 is similarly useful to illustrate the noise voltage signal from magnetic coupling induced in the second transmission line 501B by the signal current in the first transmission line 501A. As shown in FIG. 5, a voltage will be induced in the second transmission line 501B which has a magnitude that depends on the trise, $di_1(t)/dt$, of the current $i_1(t)$ in the driven transmission line 501A, and the mutual inductance coupling (M) between neighboring transmission lines, e.g. 501A and 501B. Each transmission line, 501A and 501B, has an inductance (L). As stated above, $L \approx 0.2$ nH for a 0.1 cm transmission line, 501A and 501B. In one exemplary embodiment, the current $i_1(t)$ in the first transmission line, 501A (in this example the "driven line") rises to 1 mA in 100 ps. A current, $di_1(t)/dt$, of approximately $1 \times 10^7$ A/sec is then produced on the first transmission line 501A. As presented above in connection with FIGS. 3A and 3B, the mutual inductance coupling (M) can be expressed as $M = L \times \{1/[1+(s/h)^2]\}$. In one exemplary embodiment, s is approximately equal to 3 µm, and h is approximately equal to 0.7 µm. In this embodiment, M will equate to approximately M=0.02 nano Henrys (nH).

Using the relationship that the induced voltage (Vind)= $M \times di_1(t)/dt$, Vind is approximately equal to 0.2 mV. During this 100 ps time period the induced voltage traveling down the second transmission line 501B just sees the characteristic impedance Zo of the second transmission line 501B. In one embodiment Zo is approximately 30 Ohms, so here, the current induced $i_2(t)$ in the second transmission line is $i_2(t)$=Vind/Zo or 0.007 mA. This low value current is only approximately one percent (1%) of the signal current $i_1(t)$ on the first transmission line, 501A. Hence, a large signal to noise ratio (SNR) results. In contrast, under the prior technology, if high impedance capacitive loads had been used on high characteristic impedance lines and conventional voltage signaling employed there is typically a large noise voltage between the neighboring transmission lines, 501A and 501B. In the prior technology, the large noise voltage can be about one half as big as signal voltages.

The second transmission line 501B has an equivalently rapid time constant, (L/R) to that of the first transmission line 501A. In the embodiment presented above, the time constant is approximately 7 pico seconds (ps). The noise current $i_2(t)$ in the second transmission line 501B will reach a steady state in that time constant. The noise current stays at this steady state value until the end of trise, in this embodiment 100 ps, at which point $i_1(t)$ stops changing. After this, the noise current in the second line decays away very quickly. Again, when the input impedance seen by the driver 503 is matched to the characteristic impedance Zo of the first transmission line 501A, the signal to noise ratio (SNR) due to inductive coupling between the first transmission line 501A and the second, or neighboring, transmission line 501B is of the order, (L/M) (trise/tprop). In other embodiments, the actual mutual inductance and self inductances may vary from these given values without departing from the scope of the invention.

Inductive effects which become important at high speeds include not only the self inductance of the interconnection lines, L, but also the mutual inductance between lines, M. As shown with respect to FIG. 5, previously the signal-to-noise ratio due to inductive coupling between lines is of the order, (L/M)(trise/tprop). Any technique which will minimize the mutual inductance between lines will improve the signal-to-noise ratio on long interconnection lines in integrated circuits with high switching speeds.

The present invention, as described further below, provides structures and methods through which inductive coupling on high speed interconnects can be further reduced thus increasing the signal to noise ratio across the same.

According to the teachings of the present invention, inductive coupling can be minimized by:
  (i) magnetic shields above and below the lines
  (ii) magnetic shields between lines;
These magnetic shields may be:
  (i) good conductors with a thickness greater than the skin depth, the conventional approach, but one which may not be possible or practical with interconnection lines of sub-micron dimensions
  (ii) shields with high permeability metals to minimize the mutual coupling or inductance between lines.

High speed interconnections are provided which accord exemplary performance. That is, the invention described here provides an improved and efficiently fabricated technique for high speed transmission lines on CMOS integrated circuits. In addition, the novel low input impedance CMOS circuit offers the following advantages: (1) the signal delay depends only on the velocity of light on the line and is easily predictable and reproducible, eliminating or allowing for compensation for signal and/or clock skew, (2) there are no reflections at the receiving end of the line and this minimizes ringing, and (3) noise signals will be smaller due to weaker coupling between lines resulting in better signal to noise ratios, the noise current will only be a small fraction of the signal current.

One embodiment of the invention includes a method for forming transmission lines in an integrated circuit. The method includes forming a first layer of electrically conductive material on a substrate. A first layer of insulating material is formed on the first layer of the electrically conductive material. A pair of high permeability metal lines is formed on the first layer of insulating material. The pair of high permeability metal lines includes composite hexafemte films. A transmission line is formed on the first layer of insulating material and between and parallel with the pair of high permeability metal lines. A second layer of insulating material is formed on the transmission line and the pair of high permeability metal lines. And, the method includes forming a second layer of electrically conductive material on the second layer of insulating material.

Figure 6:
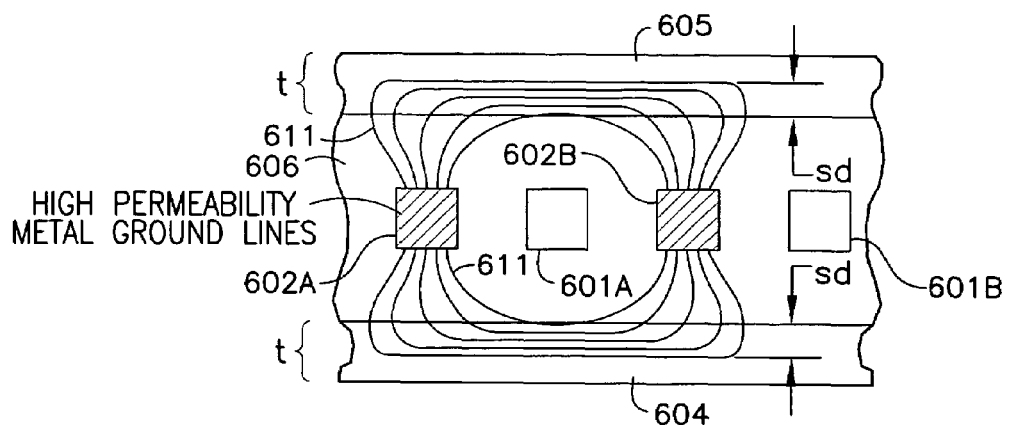
FIG. 6 illustrates one embodiment for a pair of neighboring transmission lines, according to the teachings of the present invention.

One embodiment of the invention, as discussed further below in connection with FIG. 6, is a structure where an interconnection line is located between a ground buss and a power supply buss (which for the AC signal is AC ground) and as such constitutes a low impedance transmission line interconnection. If the ground and power supply busses are thicker than the skin depth at the frequency of interest, the electric and magnetic fields will be shielded and confined to the area between these plates. As shown in the embodiment of FIG. 6, a layered high permeability shielding line is placed between interconnection lines to distort the magnetic fields and shield the lines.

Other possible configurations are shown in FIGS. 7-12. These configurations highlight the fact that a single metal might not have all the suitable properties for a given or desired implementation by systems designed for low noise operation. For example, two materials might be necessary, one which has the desired magnetic properties to confine magnetic fields and one to confine the electric fields. Accordingly, FIGS. 7-12 illustrate various alternative embodiments of the present invention as can be best suited to a particular system designed for low noise operation. These embodiments make use of a sandwich layer of both a high permeability material, well suited for magnetic shielding, as well as a low resistive conductive material that is well suited for electrical shielding. By placing even a thin layer of the high permeability material, a considerable amount of the magnetic field can be contained.

FIG. 6 illustrates one embodiment for a pair of neighboring transmission lines, 601A and 601B, according to the teachings of the present invention. FIG. 6 illustrates one or more transmission lines, shown as 601A and 601B. The one or more transmission lines, 601A and 601B, are spaced between a pair of electrically conductive planes 604 and 605. As one of ordinary skill in the art will understand upon reading this disclosure, in one embodiment at least one of the electrically conductive planes is formed on a substrate. As one of ordinary skill in the art will understand upon reading this disclosure, the substrate can include an insulator, a semiconductor material, silicon on insulator material, or other materials. The invention is not so limited.

As shown in FIG. 6, the invention includes a number of high permeability metal lines, shown in this embodiment as 602A and 602B. According to the teachings of the present invention, the number of high permeability metal lines, 602A and 602B, are formed of composite hexaferrite films. As shown in FIG. 6, the number of high permeability metal lines, 602A and 602B are interspaced between the one or more transmission lines, 601A and 601B. In one embodiment of the present invention, the one or more transmission lines, 601A and 601B, and the number or high permeability metal lines, 602A and 602B, are spaced parallel to one another and are oriented lengthwise perpendicular to the plane of the page illustrated in FIG. 6. In the invention, the one or more transmission lines, 601A and 601B, and the number or high permeability metal lines, 602A and 602B, are separated from one another and from the pair of electrically conductive planes 604 and 605 by an insulator material 606. In one embodiment of the present invention, the insulator material 606 includes an oxide.

In one embodiment as shown in FIG. 6, the pair of electrically conductive planes 604 and 605 include metal ground planes 604 and 605. In the invention, the electrically conductive planes, 604 and 605, can be independently coupled to a ground source and/or a power supply bus as the same will be known and understood by one of ordinary skill in the art. In the embodiment shown in FIG. 6, at least one of the pair of electrically conductive planes, 604 and 605, is formed to a thickness (t) which is greater than a skin depth (sd) penetrable by electrically induced magnetic field lines.

As one of ordinary skill in the art will understand upon reading this disclosure, an electrical signal transmitted across the one or more transmission lines, 601A and 601B will induce a magnetic field surrounding the one or more transmission lines, 601A and 601B. In the embodiment of FIG. 6 such a magnetic field is illustrated by magnetic field lines 611. According to the teachings of the present invention, the number of high permeability metal lines, 602A and 602B, and the electrically conductive planes, 604 and 605, provide magnetic shielding to reduce the amount of magnetically induced noise on neighboring transmission lines, e.g. 601A and 601B.

Figure 7:
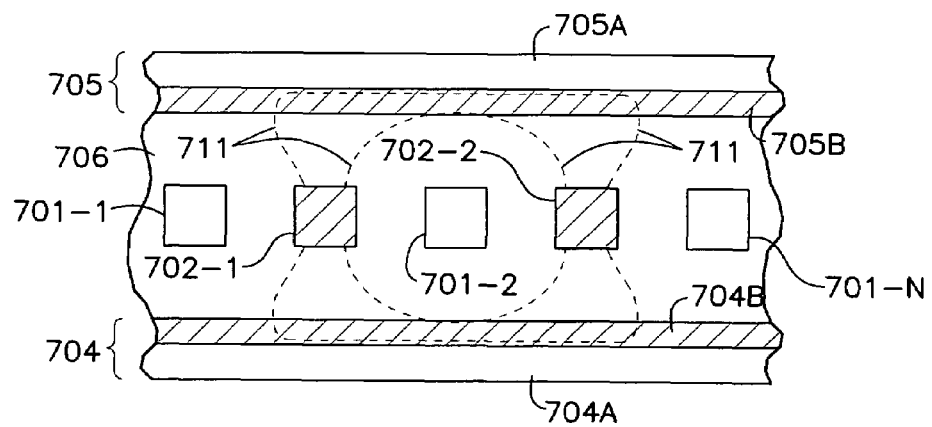
FIG. 7 illustrates another embodiment for a pair of neighboring transmission lines, according to the teachings of the present invention.

FIG. 7 illustrates another embodiment for a pair of neighboring transmission lines, 701-1 and 701-2, according to the teachings of the present invention. FIG. 7 illustrates one or more transmission lines, shown as 701-1 and 701-2. The one or more transmission lines, 701-1 and 701-2, are spaced between a pair of electrically conductive planes 704 and 705. As one of ordinary skill in the art will understand upon reading this disclosure, any number of transmission lines, 701-1, . . . , 701-N, can be spaced between the conductive planes 704 and 705. As one of ordinary skill in the art will understand upon reading this disclosure, in one embodiment at least one of the electrically conductive planes is formed on a substrate. As one of ordinary skill in the art will understand upon reading this disclosure, the substrate can include an insulator, a semiconductor material, silicon on insulator material, or other materials. The invention is not so limited.

As shown in FIG. 7, the invention includes a number of high permeability metal lines, shown in this embodiment as 702-1 and 702-2. According to the teachings of the present invention, the number of high permeability metal lines, 702-1 and 702-2, are formed of composite hexaferrite films. As shown in FIG. 7, the number of high permeability metal lines, 702-1 and 702-2 are interspaced between the one or more transmission lines, 701-1 and 701-2. In one embodiment of the present invention, the one or more transmission lines, 701-1 and 701-2, and the number or high permeability metal lines, 702-1 and 702-2, are spaced parallel to one another and are oriented lengthwise perpendicular to the plane of the page illustrated in FIG. 7. As one of ordinary skill in the art will understand upon reading this disclosure, any number of transmission lines, 701-1, . . . , 701-N can be spaced between any number of number high permeability metal lines, 702-1, . . . , 702-N. That is, one or more high permeability metal lines, 702-1, . . . , 702-N will separate one or more transmission lines, 701-1, . . . , 701-N. In the invention, the one or more transmission lines, 701-1 and 701-2, and the number or high permeability metal lines, 702-1 and 702-2, are separated from one another and from the pair of electrically conductive planes 704 and 705 by an insulator material 706. In one embodiment of the present invention, the insulator material 706 includes an oxide.

In one embodiment as shown in FIG. 7, the pair of electrically conductive planes 704 and 705 each include two layers, 704A, 704B and 705A and 705B. In this embodiment, a first layer, 704A and 705A respectively, include metal ground planes. A second layer or surface layer, 704B and 705B respectively, is formed of the same high permeability material as the number of high permeability metal lines, 702-1 and 702-2. That is, the second layer or surface layer, adjacent to the one or more transmission lines, 701-1 and 701-2, and the number of high permeability metal lines 702-1 and 702-2, are formed of composite hexaferrite films. As one of ordinary skill in the art will understand upon reading the present disclosure, the electrically conductive planes, 704 and 705, can be independently coupled to a ground source and/or a power supply bus.

As one of ordinary skill in the art will understand upon reading this disclosure, an electrical signal transmitted across the one or more transmission lines, 701-1 and 701-2 will induce a magnetic field surrounding the one or more transmission lines, 701-1 and 701-2. In the embodiment of FIG. 7 such a magnetic field is illustrated by magnetic field lines 711. According to the teachings of the present invention, the number of high permeability metal lines, 702-1 and 702-2, and the electrically conductive planes, 704 and 705, provide magnetic shielding to reduce the amount of magnetically induced noise on neighboring transmission lines, e.g. 701-1 and 701-2.

As shown in FIG. 7, the second layer or surface layer, adjacent to the one or more transmission lines, 701-1 and 701-2, and the number of high permeability metal lines 702-1 and 702-2, each formed of composite hexaferrite films, serve to shield the one or more transmission lines, 701-1 and 701-2, from such electrically induced magnetic fields. The magnetic field lines 711 shown in FIG. 7, illustrates the magnetic shielding effect provided by the number of high permeability metal lines, 702-1 and 702-2, and the second layer or surface layer 704B and 705B, from magnetic fields produces by a current transmitted in the one or more transmission lines, 701-1 and 701-2. As one of ordinary skill in the art will understand upon reading this disclosure, the first layer, 704A and 705A respectively, of the electrically conductive planes, 704 and 705, provide a lower resistance such that there is very little resistance to the path of the return current.

As shown in the embodiment of FIG. 6 and other embodiments below, the second layer, or surface layer, 704B and 705B of high permeability metal, e.g. magnetic material composite hexaferrite films, are formed on the inside of the conductive planes 704 and 705, also referred to as the Vss or ground, adjacent to the one or more transmission lines, 701-1 and 701-2. However as one of ordinary skill in the art will understand upon reading this disclosure, the second layer, or surface layer, 704B and 705B of high permeability metal can also be placed on the outside of the conductive planes 704 and 705. As one of ordinary skill in the art will understand upon reading this disclosure, the number of high permeability metal lines 702-1 and 702-2, each formed of composite hexaferrite films, and the second layer, or surface layer, 704B and 705B of high permeability metal confine the magnetic fields in both the x and y direction. However, in this embodiment, the one or more transmission lines, 701-1 and 701-2 are only separated by a high permeability magnetic material that confines the magnetic field on both the x and y direction.

Figure 8:
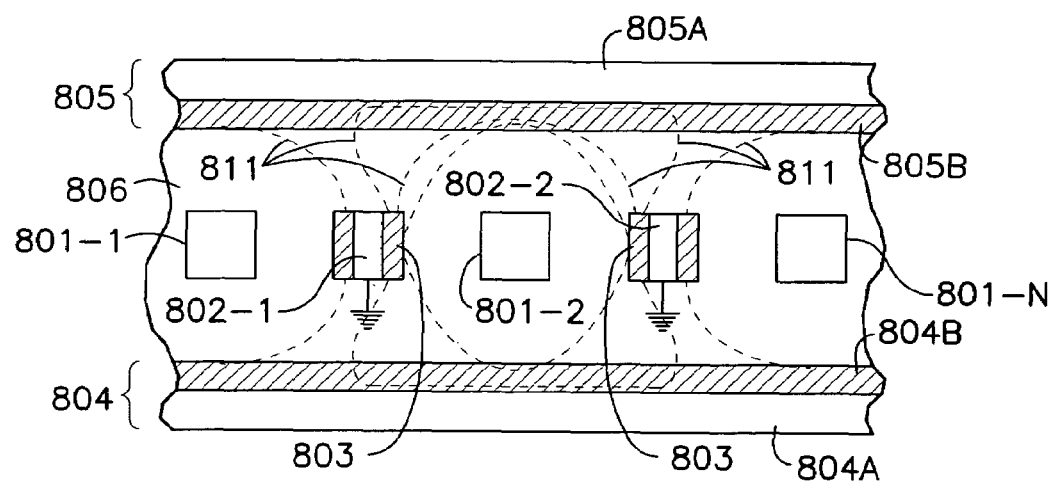
FIG. 8 illustrates another embodiment for a pair of neighboring transmission lines, according to the teachings of the present invention.

FIG. 8 illustrates another embodiment for a pair of neighboring transmission lines, 801-1 and 801-2, according to the teachings of the present invention. FIG. 8 illustrates one or more integrated circuit lines, or transmission lines, shown as 801-1 and 801-2. The one or more transmission lines, 801-1 and 801-2, are spaced between a pair of electrically conductive planes 804 and 805. As one of ordinary skill in the art will understand upon reading this disclosure, any number of transmission lines, 801-1, . . . , 801-N, can be spaced between the conductive planes 804 and 805. As one of ordinary skill in the art will understand upon reading this disclosure, in one embodiment at least one of the electrically conductive planes is formed on a substrate. As one of ordinary skill in the art will understand upon reading this disclosure, the substrate can include an insulator, a semiconductor material, silicon on insulator material, or other materials. The invention is not so limited.

As shown in FIG. 8, the invention includes a number of electrically conductive metal lines, shown in this embodiment as 802-1 and 802-2. According to the teachings of the present invention, the number of electrically conductive metal lines, 802-1 and 802-2, include at least one surface layer 803 formed of a composite hexaferrite film. As shown in the embodiment of FIG. 8, the at least one surface layer 803 formed of a composite hexaferrite film is formed on the number of electrically conductive metal lines, 802-1 and 802-2, on opposing surfaces of the number of electrically conductive lines and adjacent to the number of integrated circuit lines, 801-1 and 801-2. As shown in FIG. 8, the number of electrically conductive metal lines, 802-1 and 802-2, having at least one surface layer 803 formed of a composite hexaferrite film, are interspaced between the one or more transmission lines, 801-1 and 801-2. In one embodiment of the present invention, the one or more transmission lines, 801-1 and 801-2, and the number or electrically conductive metal lines, 802-1 and 802-2, are spaced parallel to one another and are oriented lengthwise perpendicular to the plane of the page illustrated in FIG. 8. As one of ordinary skill in the art will understand upon reading this disclosure, any number of transmission lines, 801-1, . . . , 801-N can be spaced between any number of number electrically conductive metal lines, 802-1, . . . , 802-N, having at least one surface layer 803 formed of a composite hexaferrite film. That is, one or more electrically conductive metal lines, 802-1, . . . , 802-N will separate one or more transmission lines, 801-1, . . . , 801-N. In the invention, the one or more transmission lines, 801-1 and 801-2, and the number or electrically conductive metal lines, 802-1 and 802-2, are separated from one another and from the pair of electrically conductive planes 804 and 805 by an insulator material 806. In one embodiment of the present invention, the insulator material 806 includes an oxide.

In one embodiment as shown in FIG. 8, the pair of electrically conductive planes 804 and 805 each include two layers, 804A, 804B and 805A and 805B. In this embodiment, a first layer, 804A and 805A respectively, include metal ground planes. A second layer or surface layer, 804B and 805B respectively, is formed of the same electrically conductive material as the at least one surface layer 803 on number of electrically conductive metal lines, 802-1 and 802-2. That is, the second layer or surface layer, adjacent to the one or more transmission lines, 801-1 and 801-2, and the number of electrically conductive metal lines 802-1 and 802-2, are formed of composite hexaferrite films. As one of ordinary skill in the art will understand upon reading the present disclosure, the electrically conductive planes, 804 and 805, can be independently coupled to a ground source and/or a power supply bus.

As one of ordinary skill in the art will understand upon reading this disclosure, an electrical signal transmitted across the one or more transmission lines, 801-1 and 801-2 will induce a magnetic field surrounding the one or more transmission lines, 801-1 and 801-2. In the embodiment of FIG. 8 such a magnetic field is illustrated by magnetic field lines 811. According to the teachings of the present invention, the number of electrically conductive metal lines, 802-1 and 802-2, having at least one surface layer 803 formed of a composite hexaferrite film, and the electrically conductive planes, 804 and 805, provide magnetic shielding to reduce the amount of magnetically induced noise on neighboring transmission lines, e.g. 801-1 and 801-2.

As shown in FIG. 8, the second layer or surface layer, adjacent to the one or more transmission lines, 801-1 and 801-2, and the number of electrically conductive metal lines 802-1 and 802-2, each formed of composite hexaferrite films, serve to shield the one or more transmission lines, 801-1 and 801-2, from such electrically induced magnetic fields. The magnetic field lines 811 shown in FIG. 8, illustrates the magnetic shielding effect provided by the number of electrically conductive metal lines, 802-1 and 802-2, having at least one surface layer 803 formed of a composite hexaferrite film, and the second layer or surface layer 804B and 805B, from magnetic fields produces by a current transmitted in the one or more transmission lines, 801-1 and 801-2. As one of ordinary skill in the art will understand upon reading this disclosure, the first layer, 804A and 805A respectively, of the electrically conductive planes, 804 and 805, provide a lower resistance such that there is very little resistance to the path of the return current. As one of ordinary skill in the art will understand upon reading this disclosure, FIG. 8 shows a similar arrangement to that of FIG. 7 but both the electric and magnetic fields are now confined in both the x and y direction. Here the conductors are separated by not only a high permeability magnetic material but a sandwich of both a very low resistive ground plane which acts as a low resistive return path for induced currents (which is shown grounded) and high permeability magnetic material.

Figure 9:
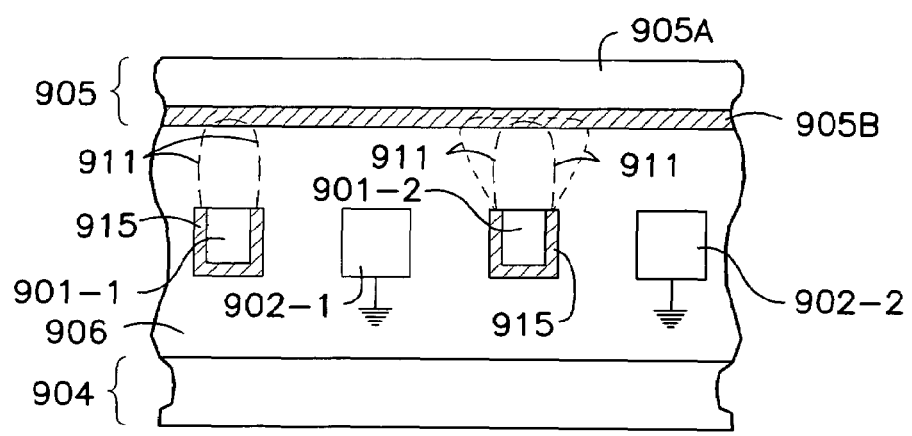
FIG. 9 illustrates another embodiment for a pair of neighboring transmission lines, according to the teachings of the present invention.

FIG. 9 illustrates another embodiment for neighboring transmission lines, 901-1 and 901-2, according to the teachings of the present invention. FIG. 9 illustrates one or more integrated circuit lines, or transmission lines, shown as 901-1 and 901-2. The one or more transmission lines, 901-1 and 901-2, are spaced between a pair of electrically conductive planes 904 and 905. As one of ordinary skill in the art will understand upon reading this disclosure, any number of transmission lines, 901-1, . . . , 901-N, can be spaced between the conductive planes 904 and 905. As one of ordinary skill in the art will understand upon reading this disclosure, in one embodiment at least one of the electrically conductive planes is formed on a substrate. As one of ordinary skill in the art will understand upon reading this disclosure, the substrate can include an insulator, a semiconductor material, silicon on insulator material, or other materials. The invention is not so limited.

As shown in FIG. 9, the invention includes a number of electrically conductive metal lines, shown in this embodiment as 902-1 and 902-2. According to the teachings of the present invention, the one or more transmission lines, 901-1 and 901-2, include at least one surface layer 915 formed of a composite hexaferrite film. As shown in the embodiment of FIG. 9, the at least one surface layer 915 of a composite hexaferrite film is formed on the one or more transmission lines, 901-1 and 901-2, on at least three sides of the number of transmission lines, 901-1 and 901-2. In this embodiment, the three sides include opposing surfaces adjacent to the number of electrically conductive lines, 902-1 and 902-2, and on a side adjacent to the first conductive plane 904. As shown in FIG. 9, the one or more transmission lines, 901-1 and 901-2, having at least one surface layer 915 formed of a composite hexaferrite film, are interspaced between the number or electrically conductive metal lines, 902-1 and 902-2. In one embodiment of the present invention, the one or more transmission lines, 901-1 and 901-2, and the number or electrically conductive metal lines, 902-1 and 902-2, are spaced parallel to one another and are oriented lengthwise perpendicular to the plane of the page illustrated in FIG. 9. As one of ordinary skill in the art will understand upon reading this disclosure, any number of transmission lines, 901-1, . . . , 901-N, having at least one surface layer 915 formed of a composite hexaferrite film, can be spaced between any number of number electrically conductive metal lines, 902-1, . . . , 902-N. That is, one or more electrically conductive metal lines, 902-1, . . . , 902-N will separate one or more transmission lines, 901-1, . . . , 901-N. In the invention, the one or more transmission lines, 901-1 and 901-2, and the number or electrically conductive metal lines, 902-1 and 902-2, are separated from one another and from the pair of electrically conductive planes 904 and 905 by an insulator material 906. In one embodiment of the present invention, the insulator material 906 includes an oxide.

In one embodiment as shown in FIG. 9, the at least one of the pair of electrically conductive planes 904 and 905 includes two layers. In the embodiment shown in FIG. 9, conductive plane 905 includes two layers, 905A and 905B. In this embodiment, conductive plane 904, and a first layer 905A for conductive plane 905, include metal ground planes. In conductive plane 905 a second layer or surface layer 905B, is formed of the same high permeability material as the at least one surface layer 915 on the one or more transmission lines, 901-1 and 901-2. That is, the second layer or surface layer, 905B adjacent to the one or more transmission lines, 901-1 and 901-2, and the number of electrically conductive metal lines 902-1 and 902-2, are formed of composite hexaferrite films. As one of ordinary skill in the art will understand upon reading the present disclosure, the electrically conductive planes, 904 and 905, can be independently coupled to a ground source and/or a power supply bus.

As one of ordinary skill in the art will understand upon reading this disclosure, an electrical signal transmitted across the one or more transmission lines, 901-1 and 901-2 will induce a magnetic field surrounding the one or more transmission lines, 901-1 and 901-2. In the embodiment of FIG. 9 such a magnetic field is illustrated by magnetic field lines 911. According to the teachings of the present invention, the one or more transmission lines, 901-1 and 901-2, having at least one surface layer 915 formed of a composite hexaferrite film, the number of electrically conductive metal lines 902-1 and 902-2, and the electrically conductive planes, 904 and 905, provide magnetic shielding to reduce the amount of magnetically induced noise on neighboring transmission lines, e.g. 901-1 and 901-2.

As shown in FIG. 9, the second layer or surface layer 905B, adjacent to the one or more transmission lines, 901-1 and 901-2, having at least one surface layer 915 formed of a composite hexaferrite film, the electrically conductive planes, 904 and 905, and the number of electrically conductive metal lines 902-1 and 902-2, serve to shield the one or more transmission lines, 901-1 and 901-2, from such electrically induced magnetic fields. The magnetic field lines 911 shown in FIG. 9, illustrates the magnetic shielding effect provided by the one or more transmission lines, 901-1 and 901-2, having at least one surface layer 915 formed of a composite hexaferrite film, the number of electrically conductive metal lines 902-1 and 902-2 and the second layer or surface layer 905B, from magnetic fields produced by a current transmitted in the one or more transmission lines, 901-1 and 901-2. As one of ordinary skill in the art will understand upon reading this disclosure, conductive plane and the first layer 905A, of the electrically conductive planes, 904 and 905, provide a lower resistance such that there is very little resistance to the path of the return current.

The embodiment provided by FIG. 9 is easy to manufacture. Here the current carrying low resistive conductors or metal lines, 901-1 and 901-2, are encased on three sides by a high permeability magnetic material and separated from one another by low resistive metal lines that are grounded. To provide magnetic field confinement in the Y direction, a sandwich layer is used at the top of the conductors, 901-1 and 901-2, as part of conductive plane 905. This sandwich layer is composed of both a low resistive component 905A as well as a high permeability component 905B. The bottom side of the embedded metal lines or conductors, 901-1 and 901-2, contain only a ground plane 904. This embodiment provides complete electric and magnetic field confinement.

Figure 10:
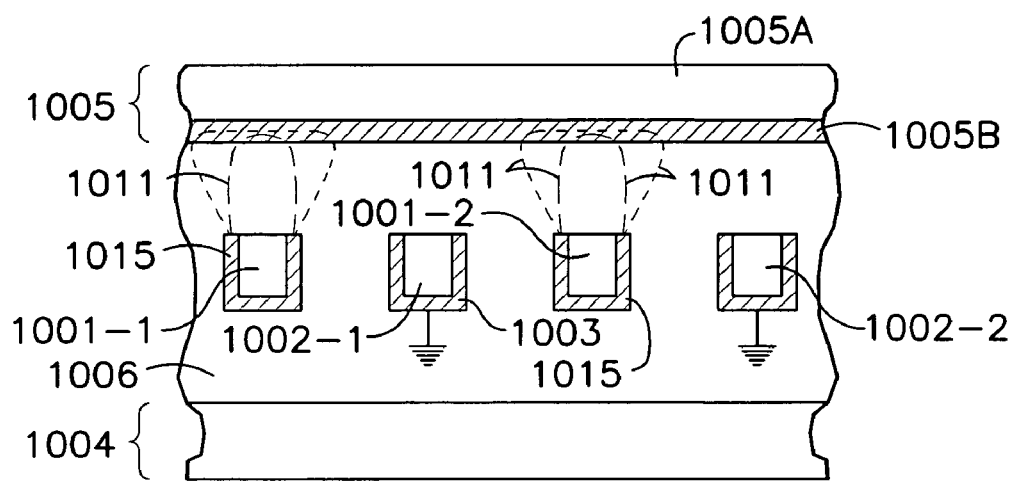
FIG. 10 illustrates another embodiment for a pair of neighboring transmission lines, according to the teachings of the present invention.

FIG. 10 illustrates another embodiment for neighboring transmission lines, 1001-1 and 1001-2, according to the teachings of the present invention. FIG. 10 illustrates one or more integrated circuit lines, or transmission lines, shown as 1001-1 and 1001-2. The one or more transmission lines, 1001-1 and 1001-2, are spaced between a pair of electrically conductive planes 1004 and 1005. As one of ordinary skill in the art will understand upon reading this disclosure, any number of transmission lines, 1001-1, . . . , 1001-N, can be spaced between the conductive planes 1004 and 1005. As one of ordinary skill in the art will understand upon reading this disclosure, in one embodiment at least one of the electrically conductive planes is formed on a substrate. As one of ordinary skill in the art will understand upon reading this disclosure, the substrate can include an insulator, a semiconductor material, silicon on insulator material, or other materials. The invention is not so limited.

As shown in FIG. 10, the invention includes a number of electrically conductive metal lines, shown in this embodiment as 1002-1 and 1002-2. According to the teachings of the present invention, the number of electrically conductive metal lines, 1002-1 and 1002-2, include at least one surface layer 1003 formed of a composite hexaferrite film. As shown in the embodiment of FIG. 10, the at least one surface layer 1003 of a composite hexaferrite film is formed on the number of electrically conductive metal lines, 1002-1 and 1002-2, on at least three sides of the number of electrically conductive metal lines, 1002-1 and 1002-2. In this embodiment, the three sides include opposing surfaces adjacent to the one or more transmission lines, 1001-1 and 1001-2, and on a side adjacent to the first conductive plane 1004. As shown in FIG. 10, the number of electrically conductive metal lines, 1002-1 and 1002-2, having at least one surface layer 1015 formed of a composite hexaferrite film, are interspaced between the one or more transmission lines, 1001-1 and 1001-2. Further, in this embodiment, the one or more transmission lines, 1001-1 and 1001-2, include at least one surface layer 1015 formed of a composite hexaferrite film. As shown in the embodiment of FIG. 10, the at least one surface layer 1015 of a composite hexaferrite film is formed on the one or more transmission lines, 1001-1 and 1001-2, on at least three sides of the number of transmission lines, 1001-1 and 1001-2. In this embodiment, the three sides include opposing surfaces adjacent to the number of electrically conductive lines, 1002-1 and 1002-2, and on a side adjacent to the first conductive plane 1004. As shown in FIG. 10, the one or more transmission lines, 1001-1 and 1001-2, having at least one surface layer 1015 formed of a composite hexaferrite film, are interspaced between the number or electrically conductive metal lines, 1002-1 and 1002-2 also having at least one surface layer 1003 formed of a composite hexaferrite film. In one embodiment of the present invention, the one or more transmission lines, 1001-1 and 1001-2, and the number or electrically conductive metal lines, 1002-1 and 1002-2, are spaced parallel to one another and are oriented lengthwise perpendicular to the plane of the page illustrated in FIG. 10. As one of ordinary skill in the art will understand upon reading this disclosure, any number of transmission lines, 1001-1, . . . , 1001-N, having at least one surface layer 1003 formed of a composite hexaferrite film, can be spaced between any number of number electrically conductive metal lines, 1002-1, . . . , 1002-N also having at least one surface layer 1003 formed of a composite hexaferrite film. That is, one or more electrically conductive metal lines, 1002-1, . . . , 1002-N will separate one or more transmission lines, 1001-1, . . . , 1001-N. In the invention, the one or more transmission lines, 1001-1 and 1001-2, and the number or electrically conductive metal lines, 1002-1 and 1002-2, are separated from one another and from the pair of electrically conductive planes 1004 and 1005 by an insulator material 1006. In one embodiment of the present invention, the insulator material 1006 includes an oxide.

In one embodiment as shown in FIG. 10, the at least one of the pair of electrically conductive planes 1004 and 1005 includes two layers. In the embodiment shown in FIG. 10, conductive plane 1005 includes two layers, 1005A and 1005B. In this embodiment, conductive plane 1004, and a first layer 1005A for conductive plane 1005, include metal ground planes. In conductive plane 1005 a second layer or surface layer 1005B, is formed of the same high permeability material as the at least one surface layer 1015 on the one or more transmission lines, 1001-1 and 1001-2 and the at least one surface layer 1003 formed on the number of electrically conductive metal lines, 1002-1 and 1002-2. That is, the second layer or surface layer, 1005B adjacent to the one or more transmission lines, 1001-1 and 1001-2, and the number of electrically conductive metal lines 1002-1 and 1002-2, are formed of composite hexaferrite films. As one of ordinary skill in the art will understand upon reading the present disclosure, the electrically conductive planes, 1004 and 1005, can be independently coupled to a ground source and/or a power supply bus.

As one of ordinary skill in the art will understand upon reading this disclosure, an electrical signal transmitted across the one or more transmission lines, 1001-1 and 1001-2 will induce a magnetic field surrounding the one or more transmission lines, 1001-1 and 1001-2. In the embodiment of FIG. 10 such a magnetic field is illustrated by magnetic field lines 1011. According to the teachings of the present invention, the one or more transmission lines, 1001-1 and 1001-2, having at least one surface layer 1015 formed of a composite hexaferrite film, the number of electrically conductive metal lines 1002-1 and 1002-2 also having at least one surface layer 1003 formed of a composite hexaferrite film, and the electrically conductive planes, 1004 and 1005, provide magnetic shielding to reduce the amount of magnetically induced noise on neighboring transmission lines, e.g. 1001-1 and 1001-2.

As shown in FIG. 10, the second layer or surface layer 1005B, adjacent to the one or more transmission lines, 1001-1 and 1001-2, having at least one surface layer 1015 formed of a composite hexaferrite film, the electrically conductive planes, 1004 and 1005, and the number of electrically conductive metal lines 1002-1 and 1002-2 also having at least one surface layer 1003 formed of a composite hexaferrite film, serve to shield the one or more transmission lines, 1001-1 and 1001-2, from such electrically induced magnetic fields. The magnetic field lines 1011 shown in FIG. 10, illustrates the magnetic shielding effect provided by the one or more transmission lines, 1001-1 and 1001-2, having at least one surface layer 1015 formed of a composite hexaferrite film, the number of electrically conductive metal lines 1002-1 and 1002-2 also having at least one surface layer 1003 formed of a composite hexaferrite film, and the second layer or surface layer 1005B, from magnetic fields produced by a current transmitted in the one or more transmission lines, 1001-1 and 1001-2. As one of ordinary skill in the art will understand upon reading this disclosure, conductive plane and the first layer 1005A, of the electrically conductive planes, 1004 and 1005, provide a lower resistance such that there is very little resistance to the path of the return current.

Figure 12:
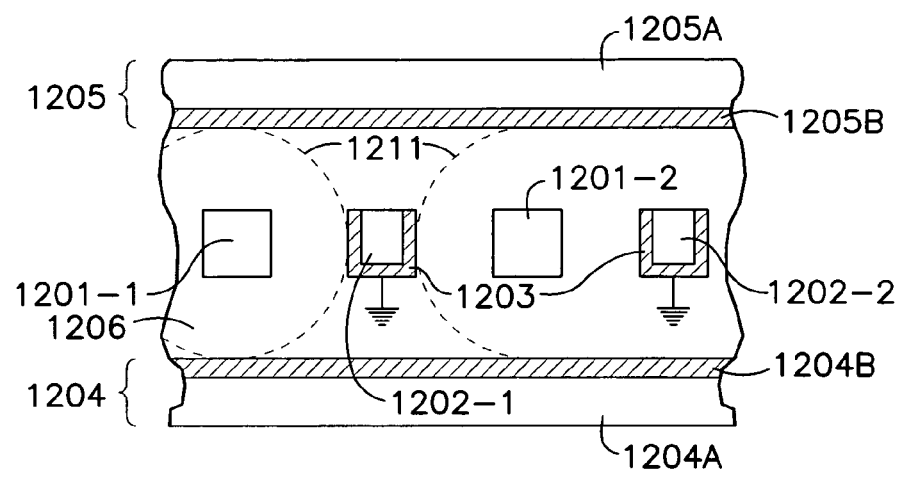
FIG. 12 illustrates another embodiment for a pair of neighboring transmission lines, according to the teachings of the present invention.

FIG. 10 is another embodiment that is very easy to manufacture. The main difference in this case being that the electrically conductive metal lines, 1002-1 and 1002-2, which were previously used only for electric field confinement in the embodiment of FIG. 9 can also be used for magnetic field confinement. An alternate configuration to that shown in FIG. 10 is shown in FIG. 12. In the embodiment of FIG. 12, as described in more detail below, the one or more transmission lines, 1001-1 and 1001-2 do not have a magnetic material around them.

Figure 11:
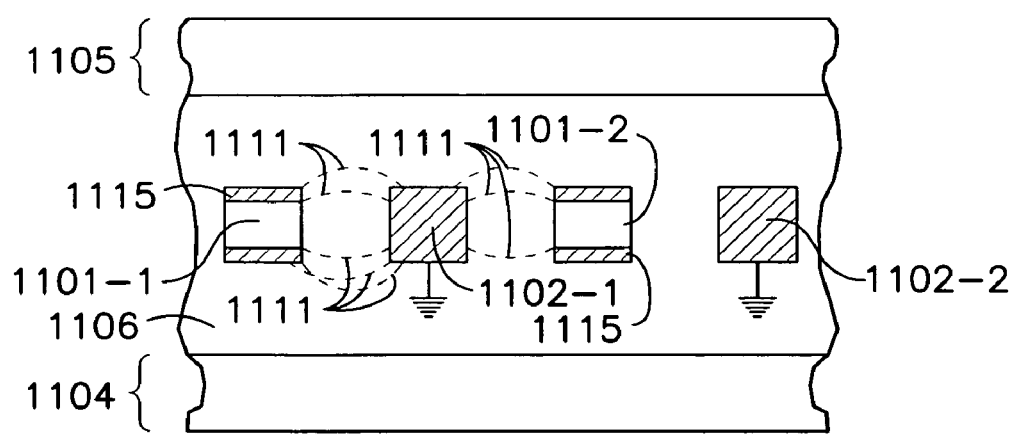
FIG. 11 illustrates another embodiment for a pair of neighboring transmission lines, according to the teachings of the present invention.

FIG. 11 illustrates another embodiment for neighboring transmission lines, 1101-1 and 1101-2, according to the teachings of the present invention. FIG. 11 illustrates one or more integrated circuit lines, or transmission lines, shown as 1101-1 and 1101-2. The one or more transmission lines, 1101-1 and 1101-2, are spaced between a pair of electrically conductive planes 1104 and 1105. As one of ordinary skill in the art will understand upon reading this disclosure, any number of transmission lines, 1101-1, . . . , 1101-N, can be spaced between the conductive planes 1104 and 1105. As one of ordinary skill in the art will understand upon reading this disclosure, in one embodiment at least one of the electrically conductive planes is formed on a substrate. As one of ordinary skill in the art will understand upon reading this disclosure, the substrate can include an insulator, a semiconductor material, silicon on insulator material, or other materials. The invention is not so limited.

As shown in FIG. 11, the invention includes a number of high permeability metal lines, shown in this embodiment as 1102-1 and 1102-2. According to the teachings of the present invention, the number of high permeability metal lines, 1102-1 and 1102-2, are formed of composite hexaferrite films. As shown in FIG. 11, the number of high permeability metal lines, 1102-1 and 1102-2 are interspaced between the one or more transmission lines, 1101-1 and 1101-2. In one embodiment of the present invention, the one or more transmission lines, 1101-1 and 1101-2, and the number or high permeability metal lines, 1102-1 and 1102-2, are spaced parallel to one another and are oriented lengthwise perpendicular to the plane of the page illustrated in FIG. 11. Further, in this embodiment, the one or more transmission lines, 1101-1 and 1101-2, include at least one surface layer 1115 formed of a composite hexaferrite film. As shown in the embodiment of FIG. 11, the at least one surface layer 1115 of a composite hexaferrite film is formed on the one or more transmission lines, 1101-1 and 1101-2, on two sides of the number of transmission lines, 1101-1 and 1101-2. In this embodiment, the two sides include opposing surfaces adjacent to the first and the second conductive planes 1104 and 1105. As shown in FIG. 11, the one or more transmission lines, 1101-1 and 1101-2, having at least one surface layer 1115 formed of a composite hexaferrite film, are interspaced between the number high permeability metal lines, 1102-1 and 1102-2. In one embodiment of the present invention, the one or more transmission lines, 1101-1 and 1101-2, and the number or high permeability metal lines, 1102-1 and 1102-2, are spaced parallel to one another and are oriented lengthwise perpendicular to the plane of the page illustrated in FIG. 11. As one of ordinary skill in the art will understand upon reading this disclosure, any number of transmission lines, 1101-1, . . . , 101-N, having at least one surface layer 1115 formed of a composite hexaferrite film, can be spaced between any number of number high permeability metal lines, 1102-1, . . . , 1102-N. That is, one or more high permeability metal lines, 1102-1, . . . , 1102-N will separate one or more transmission lines, 1101-1, . . . , 1101-N. In the invention, the one or more transmission lines, 1101-1 and 1101-2, and the number or high permeability metal lines, 1102-1 and 1102-2, are separated from one another and from the pair of electrically conductive planes 1104 and 1105 by an insulator material 1106. In one embodiment of the present invention, the insulator material 1106 includes an oxide. In an alternative embodiment, the one or more transmission lines, 1101-1 and 1101-2, and the number or high permeability metal lines, 1102-1 and 1102-2, do not have to be located between the pair of electrically conductive planes 1104 and 1105, but are still encapsulated by an insulator material 1106. As one of ordinary skill in the art will understand upon reading the present disclosure, the high permeability planes, 1104 and 1105, can be independently coupled to a ground source and/or a power supply bus.

As one of ordinary skill in the art will understand upon reading this disclosure, an electrical signal transmitted across the one or more transmission lines, 1101-1 and 1101-2 will induce a magnetic field surrounding the one or more transmission lines, 1101-1 and 1101-2. In the embodiment of FIG. 11 such a magnetic field is illustrated by magnetic field lines 1112. According to the teachings of the present invention, the one or more transmission lines, 1101-1 and 1101-2, having at least one surface layer 1115 formed of a composite hexaferrite film, the number of high permeability metal lines 1102-1 and 1102-2, and the electrically conductive planes, 1104 and 1105, provide magnetic shielding to reduce the amount of magnetically induced noise on neighboring transmission lines, e.g. 1101-1 and 1101-2.

As shown in FIG. 11, the one or more transmission lines, 1101-1 and 1101-2, having at least one surface layer 1115 formed of a composite hexaferrite film, the electrically conductive planes, 1104 and 1105, and the number of high permeability metal lines 1102-1 and 1102-2, serve to shield the one or more transmission lines, 1101-1 and 1101-2, from such electrically induced magnetic fields. The magnetic field lines 1111 shown in FIG. 11, illustrates the magnetic shielding effect provided by the one or more transmission lines, 1101-1 and 1101-2, having at least one surface layer 1115 formed of a composite hexaferrite film, and the number of high permeability metal lines 1102-1 and 1102-2, from magnetic fields produced by a current transmitted in the one or more transmission lines, 1101-1 and 1101-2. As one of ordinary skill in the art will understand upon reading this disclosure, the electrically conductive planes, 1104 and 1105, provide a lower resistance such that there is very little resistance to the path of the return current. FIG. 11 is another possibility that provides for magnetic confinement in all directions, but in this case, the magnetic material is only placed at the top and bottom of the one or more transmission lines, 1101-1 and 1101-2. The one or more transmission lines, 1101-1 and 1101-2 are separated by a high permeability magnetic material, e.g. the number of high permeability metal lines 1102-1 and 1102-2. In the embodiment of FIG. 1 the electrically conductive planes 1104 and 1105 encloses the one or more transmission lines, 1101-1 and 1101-2 with low resistive metals on both sides.

FIG. 12 illustrates another embodiment for neighboring transmission lines, 1201-1 and 1201-2, according to the teachings of the present invention. FIG. 12 illustrates one or more integrated circuit lines, or transmission lines, shown as 1201-1 and 1201-2. The one or more transmission lines, 1201-1 and 1201-2, are spaced between a pair of electrically conductive planes 1204 and 1205. As one of ordinary skill in the art will understand upon reading this disclosure, any number of transmission lines, 1201-1, . . . , 1201-N, can be spaced between the conductive planes 1204 and 1205. As one of ordinary skill in the art will understand upon reading this disclosure, in one embodiment at least one of the electrically conductive planes is formed on a substrate. As one of ordinary skill in the art will understand upon reading this disclosure, the substrate can include an insulator, a semiconductor material, silicon on insulator material, or other materials. The invention is not so limited.

As shown in FIG. 12, the invention includes a number of electrically conductive metal lines, shown in this embodiment as 1202-1 and 1202-2. According to the teachings of the present invention, the number of electrically conductive metal lines, 1202-1 and 1202-2, include at least one surface layer 1203 formed of a composite hexaferrite film. As shown in the embodiment of FIG. 12, the at least one surface layer 1203 of a composite hexaferrite film is formed on the number of electrically conductive metal lines, 1202-1 and 1202-2, on at least three sides of the number of electrically conductive metal lines, 1202-1 and 1202-2. In this embodiment, the three sides include opposing surfaces adjacent to the one or more transmission lines, 1201-1 and 1201-2, and on a side adjacent to the first conductive plane 1204. As shown in FIG. 12, the number of electrically conductive metal lines, 1202-1 and 1202-2, having at least one surface layer 1203 formed of a composite hexaferrite film, are interspaced between the one or more transmission lines, 1201-1 and 1201-2. As shown in FIG. 12, the one or more transmission lines, 1201-1 and 1201-2 are interspaced between the number or electrically conductive metal lines, 1202-1 and 1202-2 having at least one surface layer 1203 formed of a composite hexaferrite film. In one embodiment of the present invention, the one or more transmission lines, 1201-1 and 1201-2, and the number or electrically conductive metal lines, 1202-1 and 1202-2, are spaced parallel to one another and are oriented lengthwise perpendicular to the plane of the page illustrated in FIG. 12. As one of ordinary skill in the art will understand upon reading this disclosure, any number of transmission lines, 1201-1, . . . , 1201-N, can be spaced between any number of number electrically conductive metal lines, 1202-1, . . . , 1202-N having at least one surface layer 1203 formed of a composite hexaferrite film. That is, one or more electrically conductive metal lines, 1202-1, . . . , 1202-N will separate one or more transmission lines, 1201-1, . . . , 1201-N. In the invention, the one or more transmission lines, 1201-1 and 1201-2, and the number or electrically conductive metal lines, 1202-1 and 1202-2, are separated from one another and from the pair of electrically conductive planes 1204 and 1205 by an insulator material 1206. In one embodiment of the present invention, the insulator material 1206 includes an oxide.

In one embodiment as shown in FIG. 12, the pair of electrically conductive planes 1204 and 1205 each include two layers, 1204A, 1204B and 1205A and 1205B. In this embodiment, a first layer, 1204A and 1205A respectively, include metal ground planes. A second layer or surface layer, 1204B and 1205B respectively, is formed of the same electrically conductive material as the at least one surface layer 1203 on number of electrically conductive metal lines, 1202-1 and 1202-2. That is, the second layer or surface layer, adjacent to the one or more transmission lines, 1201-1 and 1201-2, and the at least one surface layer 1203 on the number of electrically conductive metal lines 1202-1 and 1202-2, are formed of composite hexaferrite films. As one of ordinary skill in the art will understand upon reading the present disclosure, the electrically conductive planes, 1204 and 1205, can be independently coupled to a ground source and/or a power supply bus.

As one of ordinary skill in the art will understand upon reading this disclosure, an electrical signal transmitted across the one or more transmission lines, 1201-1 and 1201-2 will induce a magnetic field surrounding the one or more transmission lines, 1201-1 and 1201-2. In the embodiment of FIG. 12 such a magnetic field is illustrated by magnetic field lines 1211. According to the teachings of the present invention, the one or more transmission lines, 1201-1 and 1201-2, the number of electrically conductive metal lines 1202-1 and 1202-2 having at least one surface layer 1203 formed of a composite hexaferrite film, and the electrically conductive planes, 1204 and 1205, provide magnetic shielding to reduce the amount of magnetically induced noise on neighboring transmission lines, e.g. 1201-1 and 1201-2.

As shown in FIG. 12, the second layer or surface layer 1204B and 1205B, adjacent to the one or more transmission lines, 1201-1 and 1201-2 and the number of electrically conductive metal lines 1202-1 and 1202-2 having at least one surface layer 1203 formed of a composite hexaferrite film, serve to shield the one or more transmission lines, 1201-1 and 1201-2, from such electrically induced magnetic fields. The magnetic field lines 1211 shown in FIG. 12, illustrate the magnetic shielding effect provided by the number of electrically conductive metal lines 1202-1 and 1202-2 having at least one surface layer 1203 formed of a composite hexaferrite film, and the second layer or surface layer 1204B and 1205B, from magnetic fields produced by a current transmitted in the one or more transmission lines, 1201-1 and 1201-2. As one of ordinary skill in the art will understand upon reading this disclosure, the first layers 1204A and 1205A, of the electrically conductive planes, 1204 and 1205, provide a lower resistance such that there is very little resistance to the path of the return current. FIG. 12 highlights a configuration that is similar to FIG. 10 but allows for more space to be used for the one or more transmission lines, 1201-1 and 1201-2 since they are not encased on magnetic material.

Figure 13:
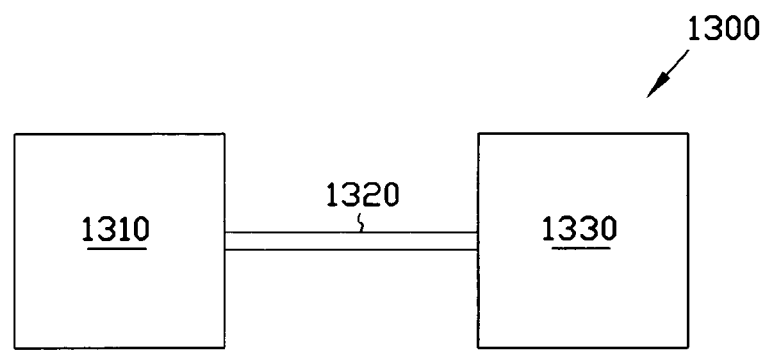
FIG. 13 is a block diagram which illustrates an embodiment of a system using line signaling according to teachings of the present invention.

FIG. 13 is a block diagram which illustrates an embodiment of a system 1300 using line signaling according to teachings of the present invention. The system 1300 includes a low output impedance driver 1310 having a driver impedance, as is well known in the art. The low output impedance driver 1310 is coupled to a transmission line circuit 1320. Embodiments of the transmission line circuit 1320 are described and presented above with reference to FIGS. 6-12. Moreover, the system 1300 includes a termination circuit 1330 having a termination impedance that is matched to the impedance of the transmission line circuit 1320.

Figure 14:
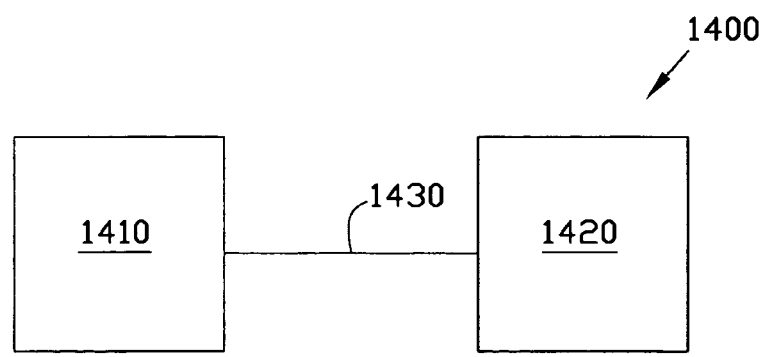
FIG. 14 is a block diagram which illustrates another embodiment of a system according to teaching of the present invention.

FIG. 14 is a block diagram which illustrates an embodiment of a system 1400 according to teaching of the present invention. The system 1400 includes an integrated circuit 1410. The integrated circuit 1410 includes the transmission line circuit described and presented above with reference to FIGS. 6-12. Additionally, the system 1400 includes a processor 1420 that is operatively coupled to the integrated circuit 1410. The processor 1420 is coupled to the integrated circuit 1410 through a system bus 1430. In one embodiment, the processor 1420 and the integrated circuit 1410 are on the same semiconductor chip.

Composite Hexaferrite Films

Recently, multiple layer chip inductors applied in the hyperfrequency regions have been rapidly developed as surface mounting devices. Multilayer chip inductors are produced by coating ferrites and internal electrode pastes alternately and then coating. Because multilayer technology has become mature, the properties of multilayer chip inductors largely depend on the electromagnetic properties of the low-temperature sintered ferrites. Much work has focused on the NiZn system ferrite applied in medium to high-frequency regions, 1<300 MHz. As for hyperfrequency regions (300<1000 MHz), no ideal material has been adopted so far.

$Co_2Z$ ferrite with planar structure is considered to be a candidate material for multilayer chip inductors because of its high initial permeability and its high Curie temperature. Especially its high cutoff frequency of 3 GHz (much higher than that of 300 MHz for spinel ferries) brings it into the hyperfrequency region useful for chip inductor and communication components. (See generally, H. G. Zhang, J. Zhou, High Technol. Lett (Chin), 10, (115), 96-97, 2000; and H. M. Song, C. J. Chen, H. C. Lin, IEEE Trans, Magn., 30, (6), 4875-4878, 1994). From the crystallographic point of view, Z-type hexaferrites are among the most complex compounds in the family of hexaferrites with planar hexagonal structure. The unit cell of a z-type hexaferrite contain 140 atoms, and belongs to the $P6_3/mmc$ space group. Metal ions ($Fe^{3+}$ and $Co^{2+}$), however, are located in nonequivalent interstitial sites. Theoretically, the hexaferrite can be treated as a sum of two simpler hexaferrites, namely of M ($BaFe_{12}O_{19}$) and Y ($Ba_2CO_2Fe_{12}O_{22}$) types. (See generally, Hongguo Zhang, et al., "Investigation on structure and properties of low-temperature sintered composite ferrites", Materials Research Bulletin, 35, 2207-2215, 2001).

In the present invention, the method disclosed in the above article by Zhang and et al. is followed in choosing different compositions of the composite ferrite system $(1-x)Ba_3CO_2Fe_{24}O_{41}+x(Ni_{0.60}Zn_{0.20}Cu_{0.20})Fe_2O_4+0.5$ wt % $Bi_2O_3$, where $x=0.1$ and $0.2$. According to the article by Zhang, an attempt was made both to promote formation of the dense composite ferrite at a low temperature and to improve the microstructure and properties of the sintered materials. Therein a 0.5 wt % $Bi_2O_3$ dopant was taken as a fixed experimental variables, and was used to lower the sintering temperature, prevent $(Ni_{0.60}Zn_{0.20}Cu_{0.20})Fe_2O_4$ from agglomeration on the grain boundaries, suppress abnormal grain growth, and hinder $(Ni_{0.60}Zn_{0.20}Cu_{0.20})Fe_2O_4$ migration or diffusion into $CO_2Z$ grains.

The experimental powders of $(Ni_{0.60}Zn_{0.20}Cu_{0.20})Fe_2O_4$ and $CO_2Z$ ferrites were synthesized by the gel self-propagating method. Based on sol-gel technique, ultrafine and highly reactive powders were obtained and then utilized to synthesize composite ferrites. The method could make the dry blend-homogeneous organic matter propagate for a few hours after igniting. The ignited residual contained a stoichiometric amount of cations, and could be used to synthesize various pure ferrite without calcining powders.

The powders were mixed in a ball mill for 4 hours. The mixed powders were then pressed in a stainless steel die under a pressure of about 40,000 $N/m_2^2$ with 5 wt % PVA as lubricant. The pressed pellets and samples sintered in air for 4 hours and cooled in the furnace. After each sintering experiment, the weights and dimensions of the sample were measured at room temperature to determine bulk densities. An HP4191A impedance analyzer was used to measure the frequency range of 1-1000 MHz.

Samples with the composition $x=0.10$ and $0.15$ presented hyperfrequency properties at low sintering temperatures: an initial permeability of 5.5, a quality factor of more than 20, and a cutoff frequency of above 2 GHz. Moreover, the electrical resistivity was $2\times10^7$ ohm-cm, and the dielectric constant was about 15. All these meet an important requirement for fabrication of multilayer chip inductors.

Although multiple layer inductors can be produced by coating ferrite pastes or other coating techniques, they can be alternatively be deposited using sputtering techniques which can be better suited for IC fabrication processing. In this case a sputtering target can be used that results in the deposition of the final film composition being that of the desired composition. As different elements of the sputtering target have different sputter rates, it should be noted that the composition of the sputtering target does not necessary have to be of the same composition as the final film. For example in order to deposit a film of $CO_2Z(Ba_3CO_2Fe_{24}O_{41})$ or $(Ni_{0.60}Zn_{0.20}Cu_{0.20})Fe_2O_4$, a sputtering target can be used that has all the elements in it but not necessarily in that exact ratio. One advantage of using sputtering techniques is the lower and shorter temperature durations that might be required instead of the conventional sintering approaches. For example, rapid thermal annealing (RTA) can be done after sputtering to anneal and sinter films. Anneal temperature are dependent on the thickness and composition of the films and can vary from 500 to 1000 degrees Celsius. Further the use of sputtering or evaporation techniques whether done with a single or a multitude of targets can achieve the structural geometries and cross-section shown in the embodiments of FIGS. 6-12. Although the use of sputtering techniques can be expensive for depositing material with more than two or three elements it can be cost competitive for three or fewer elements. The process techniques and materials described in this section represent typical materials, however alternative materials and thin film processing compatible for wafer processing can be employed.

Any technique which can or has been used to produce multilayer inductors with films of high permeability magnetic particles can be adapted to producing films for magnetic shielding according to the teachings of the present invention.

CONCLUSION

Thus, structures and methods are provided for improved, high speed transmission lines on integrated circuits. High speed interconnections are provided which accord exemplary performance. That is, the invention described here provides an improved and efficiently fabricated technique for high speed transmission lines on CMOS integrated circuits. In addition, the novel low input impedance CMOS circuit offers the following advantages: (1) the signal delay depends only on the velocity of light on the line and is easily predictable and reproducible, eliminating or allowing for compensation for signal and/or clock skew, (2) there are no reflections at the receiving end of the line and this minimizes ringing, and (3) noise signals will be smaller due to weaker coupling between lines resulting in better signal to noise ratios, the noise current will only be a small fraction of the signal current.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:
1. An electronic system comprising:
a processor; and
an integrated circuit operatively coupled to the processor, the integrated circuit including:
a first conductive plane on a substrate;
a first layer of insulating material on the first conductive plane;

a number of transmission lines on the first layer of insulating material;

a number of high permeability metal lines on the first layer of insulating material, each high permeability metal line including a ferrite, the high permeability metal lines interposed among and parallel with the transmission lines;

a second layer of insulating material on the transmission lines and the high permeability metal lines; and a second conductive plane on the second layer of insulating material.

2. The electronic system of claim 1, wherein the ferrite of each high permeability metal line is a composite ferrite.

3. The electronic system of claim 1, wherein the ferrite of each high permeability metal line is a composite hexaferrite.

4. The electronic system of claim 1, wherein the ferrite of each high permeability metal line is a $Co_2Z$ ferrite.

5. The electronic system of claim 1, wherein each ferrite includes a composite hexaferrite film containing $(1-x)Ba_3Co_2Fe_{24}O_{41}+x(Ni_{0.60}Zn_{0.20}Cu_{0.20})Fe_2O_4+0.5$ wt % $Bi_2O_3$ with x substantially equal to 0.1.

6. The electronic system of claim 1, wherein each ferrite includes a composite hexaferrite film containing $(1-x)Ba_3Co_2Fe_{24}O_{41}+x(Ni_{0.60}Zn_{0.20}Cu_{0.20})Fe_2O_4+0.5$ wt % $Bi_2O_3$ with x substantially equal to 0.2.

7. The electronic system of claim 1, wherein at least one of the first and second conductive planes is a ground plane.

8. The electronic system of claim 1, wherein the first and second layers of insulating material include an oxide layer.

9. The electronic system of claim 1, wherein each transmission line has a thickness and a width of approximately 1.0 μm.

10. The electronic system of claim 1, wherein the integrated circuit is a memory device coupled to the processor by a system bus.

11. The electronic system of claim 1, wherein each transmission line has a width which is greater than a thickness of the transmission line.

12. The electronic system of claim 1, wherein at least one transmission line has a first end coupled to a low output impedance driver having a driver impedance and a second end coupled to a termination circuit having a termination impedance that is matched to the driver impedance.

13. An electronic system comprising:
a processor; and
an integrated circuit operatively coupled to the processor, the integrated circuit including:
a first conductive plane on a substrate;
a layer of insulating material on the first conductive plane;
a number of transmission lines in the layer of insulating material;
a number of magnetic metal lines in the layer of insulating material, each magnetic metal line including a ferrite, the magnetic metal lines interposed among and parallel with the transmission lines; and
a second conductive plane on the layer of insulating material, wherein at least one of the first and second conductive planes includes two layers, a conductive layer and a plane of magnetic material.

14. The electronic system of claim 13, wherein the ferrite of each magnetic metal line is a composite ferrite.

15. The electronic system of claim 13, wherein the ferrite of each magnetic metal line is a composite hexaferrite.

16. The electronic system of claim 13, wherein the ferrite of each magnetic metal line is a $Co_2Z$ ferrite.

17. The electronic system of claim 13, wherein each ferrite includes a composite hexafemte film containing $(1-x)Ba_3Co_2Fe_{24}O_{41}=x(Ni_{0.60}Zn_{0.20}Cu_{0.20})Fe_2O_4+0.5$ wt % $Bi_2O_3$ with x substantially equal to 0.1.

18. The electronic system of claim 13, wherein each ferrite includes a composite hexaferrite film containing $(1-x)Ba_3Co_2Fe_{24}O_{41}+x(Ni_{0.60}Zn_{0.20}Cu_{0.20})Fe_2O_4+0.5$ wt % $Bi_2O_3$ with x substantially equal to 0.2.

19. The electronic system of claim 13, wherein the conductive layer is a metal ground plane and the plane of magnetic material includes a composite hexaferrite film.

20. The electronic system of claim 13, wherein the first and second conductive planes both include two layers, a conductive layer and a plane of magnetic material, the magnetic material being the same as for the magnetic metal lines.

21. The electronic system of claim 13, wherein the conductive layer has a resistance lower than a resistance of the plane of magnetic material.

22. The electronic system of claim 13, wherein the conductive layer is a metal conductive plane with the plane of magnetic material closer to the transmission lines than the metal conductive plane.

23. The electronic system of claim 13, wherein the conductive layer is a metal conductive plane closer to the transmission lines than the plane of magnetic material.

24. The electronic system of claim 13, wherein at least one transmission line has a first end coupled to a low output impedance driver having a driver impedance and a second end coupled to a termination circuit having a termination impedance that is matched to the driver impedance.

25. The electronic system of claim 13, wherein the integrated circuit is a memory device coupled to the processor by a system bus.

26. An electronic system comprising:
a processor; and
an integrated circuit operatively coupled to the processor, the integrated circuit including:
a first conductive plane on a substrate;
a first layer of insulating material on the first conductive plane;
a number of transmission lines on the first layer of insulating material;
a number of conductive metal lines on the first layer of insulating material, the conductive metal lines interposed among and parallel with the transmission lines, wherein each conductive metal line has at least one surface layer having a high
permeability material containing a ferrite encasing the conductive metal line on two opposing sides parallel to the transmission lines;
a second layer of insulating material on the transmission lines and the conductive metal lines; and
a second conductive plane on the second layer of insulating material, wherein at least one of the first and second conductive planes includes two layers, a conductive layer and a plane of high permeability material.

27. The electronic system of claim 26, wherein the ferrite of each conductive metal line is a composite ferrite.

28. The electronic system of claim 26, wherein the ferrite of each conductive metal line is a composite hexaferrite.

29. The electronic system of claim 26, wherein the ferrite of each conductive metal line is a $Co_2Z$ ferrite.

30. The electronic system of claim 26, wherein each ferrite includes a composite hexaferrite film containing $(1-x)Ba_3Co_2Fe_{24}O_{41}+x(Ni_{0.60}Zn_{0.20}Cu_{0.20})Fe_2O_4+0.5$ wt % $Bi_2O_3$ with x substantially equal to 0.1.

31. The electronic system of claim 26, wherein each ferrite includes a composite hexafemte film containing $(1-x)Ba_3Co_2Fe_{24}O_{41}+x(Ni_{0.60}Zn_{0.20}Cu_{0.20})Fe_2O_4+0.5$ wt % $Bi_2O_3$ with x substantially equal to 0.2.

32. The electronic system of claim 26, wherein the conductive layer is a metal ground plane and the plane of high permeability material includes a composite hexafemte film.

33. The electronic system of claim 26, wherein the first and second conductive planes both include two layers, a conductive layer and a plane of high permeability material, the high permeability material being the same as for the high permeability metal lines.

34. The electronic system of claim 26, wherein the conductive layer is a metal conductive plane with the plane of high permeability material closer to the transmission lines than the metal conductive plane.

35. The electronic system of claim 26, wherein each transmission line has a width which is greater than a thickness of the transmission line.

36. The electronic system of claim 26, wherein at least one transmission line has a first end coupled to a low output impedance driver having a driver impedance and a second end coupled to a termination circuit having a termination impedance that is matched to the driver impedance.

37. The electronic system of claim 26, wherein the integrated circuit is a memory device coupled to the processor by a system bus.

38. An electronic system comprising:
a processor; and
an integrated circuit operatively coupled to the processor, the integrated circuit including:
a first conductive plane on a substrate;
a first layer of insulating material on the first conductive plane;
a number of transmission lines on the first layer of insulating material;
a number of conductive metal lines on the first layer of insulating material, the conductive metal lines interposed among and parallel with the transmission lines, wherein each conductive metal line has at least one surface layer having a high permeability material containing a ferrite encasing the conductive metal line on at least three sides;
a second layer of insulating material on the transmission lines and the conductive metal lines; and
a second conductive plane on the second layer of insulating material, wherein at least one of the first and second conductive planes includes two layers, a conductive layer and a plane of high permeability material.

39. The electronic system of claim 38, wherein the ferrite of each conductive metal line is a composite ferrite.

40. The electronic system of claim 38, wherein the ferrite of each conductive metal line is a composite hexafemte.

41. The electronic system of claim 38, wherein the ferrite of each conductive metal line is a $Co_2Z$ ferrite.

42. The electronic system of claim 38, wherein each ferrite includes a composite hexaferrite film containing $(1-x)Ba_3Co_2Fe_{24}O_{41}+x(Ni_{0.60}Zn_{0.20}Cu_{0.20})Fe_2O_4+0.5$ wt % $Bi_2O_3$ with x substantially equal to 0.1.

43. The electronic system of claim 38, wherein each ferrite includes a composite hexaferrite film containing $(1-x)Ba_3Co_2Fe_{24}O_{41}+x(Ni_{0.60}Zn_{0.20}Cu_{0.20})Fe_2O_4+0.5$ wt % $Bi_2O_3$ with x substantially equal to 0.2.

44. The electronic system of claim 38, wherein the conductive layer is a metal ground plane and the plane of high permeability material includes a composite hexafemte film.

45. The electronic system of claim 38, wherein the first and second conductive planes both include two layers, a conductive layer and a plane of high permeability material, the high permeability material being the same as for the high permeability material encasing each conductive metal line on at least three sides.

46. The electronic system of claim 38, wherein the conductive layer is a metal conductive plane with the plane of high permeability material closer to the transmission lines than the metal conductive plane.

47. The electronic system of claim 38, wherein the conductive layer is a metal conductive layer closer to the number of transmission lines than the plane of high permeability material.

48. The electronic system of claim 38, wherein each conductive metal line encased on at least three sides is configured with two sides of the three sides parallel to the number of transmission lines.

49. The electronic system of claim 38, wherein at least one transmission line has a first end coupled to a low output impedance driver having a driver impedance and a second end coupled to a termination circuit having a termination impedance that is matched to the driver impedance.

50. The electronic system of claim 38, wherein the integrated circuit is a memory device coupled to the processor by a system bus.

* * * * *

UNITED STATES PATENT AND TRADEMARK OFFICE
CERTIFICATE OF CORRECTION

PATENT NO. : 7,327,016 B2 Page 1 of 1
APPLICATION NO. : 10/910676
DATED : February 5, 2008
INVENTOR(S) : Forbes et al.

It is certified that error appears in the above-identified patent and that said Letters Patent is hereby corrected as shown below:

In column 26, line 2, in Claim 17, delete "hexafemte" and insert -- hexaferrite --, therefor.

In column 26, line 3, in Claim 17, delete "=x" and insert -- +x --, therefor.

In column 27, line 4, in Claim 31, delete "hexafemte" and insert -- hexaferrite --, therefor.

In column 27, line 9, in Claim 32, delete "hexafemte" and insert -- hexaferrite --, therefor.

In column 28, line 7, in Claim 40, delete "hexafemte." and insert -- hexaferrite. --, therefor.

In column 28, line 20, in Claim 44, delete "hexafemte" and insert -- hexaferrite --, therefor.

Signed and Sealed this

Thirteenth Day of May, 2008

JON W. DUDAS
*Director of the United States Patent and Trademark Office*